US012685000B2

(12) United States Patent
Kim

(10) Patent No.: US 12,685,000 B2
(45) Date of Patent: Jul. 14, 2026

(54) DISPLAY DEVICE

(71) Applicant: Samsung Display Co., LTD., Yongin-si (KR)

(72) Inventor: Minsoo Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 342 days.

(21) Appl. No.: 18/239,412

(22) Filed: Aug. 29, 2023

(65) Prior Publication Data

US 2024/0130206 A1    Apr. 18, 2024

(30) Foreign Application Priority Data

Oct. 18, 2022    (KR) ......................... 10-2022-0134246

(51) Int. Cl.
*H10K 59/80*         (2023.01)
*G06F 3/041*         (2006.01)
*H10K 59/40*         (2023.01)
*H10K 59/35*         (2023.01)

(52) U.S. Cl.
CPC ....... *H10K 59/8792* (2023.02); *G06F 3/0412* (2013.01); *H10K 59/40* (2023.02); *H10K 59/35* (2023.02)

(58) Field of Classification Search
CPC .... H10K 59/8792; H10K 59/40; H10K 59/35; H10K 59/38; H10K 59/875; H10K 59/126; H10K 59/50; H10K 50/865; G06F 3/0412; G02B 5/201; G02B 2207/123; G02B 5/003; G02F 1/13338; G02F 1/133504; G02F 1/133512; G02F 1/133514;

(Continued)

(56) References Cited

U.S. PATENT DOCUMENTS

| | | | | |
|---|---|---|---|---|
| 11,489,145 | B2 | 11/2022 | Bae et al. | |
| 2018/0188837 | A1* | 7/2018 | Son | H10K 59/122 |
| 2019/0198574 | A1* | 6/2019 | Jun | G06F 3/0412 |

(Continued)

FOREIGN PATENT DOCUMENTS

| | | |
|---|---|---|
| KR | 1020180062183 A | 6/2018 |
| KR | 1020190004863 A | 1/2019 |

(Continued)

OTHER PUBLICATIONS

Extended European Search Report mailed Feb. 20, 2024 in EP Application No. 23194380.4, 7 pages.

*Primary Examiner* — S M Sohel Imtiaz
(74) *Attorney, Agent, or Firm* — CANTOR COLBURN LLP

(57) ABSTRACT

A display device includes: a substrate including a light emitting area and a non-light emitting area adjacent to the light emitting area, a light emitting element disposed in the light emitting area on the substrate, an encapsulation layer disposed on the light emitting element, a first light blocking layer disposed in the non-light emitting area on the encapsulation layer, a second light blocking layer disposed in the light emitting area on the encapsulation layer, where the second light blocking layer includes a same material as the first light blocking layer, and a plurality of openings is defined through the second light blocking layer, and a color filter layer disposed on the first light blocking layer and the second light blocking layer.

20 Claims, 23 Drawing Sheets

(58) Field of Classification Search
CPC .......... G02F 1/133614; H10H 20/8513; H10H
20/855; H10H 29/142
See application file for complete search history.

(56) References Cited

U.S. PATENT DOCUMENTS

| | | | |
|---|---|---|---|
| 2020/0144550 A1* | 5/2020 | Lee | H10K 50/865 |
| 2020/0233516 A1* | 7/2020 | Hwang | H10K 50/84 |
| 2020/0287159 A1* | 9/2020 | Lee | H10K 59/8722 |
| 2021/0042493 A1* | 2/2021 | Lius | G09G 3/2003 |
| 2021/0167144 A1* | 6/2021 | Lim | H10K 59/875 |
| 2022/0173361 A1 | 6/2022 | Cho et al. | |
| 2022/0238606 A1 | 7/2022 | Jeong et al. | |

FOREIGN PATENT DOCUMENTS

| | | | | |
|---|---|---|---|---|
| KR | 101983065 B1 | 5/2019 | | |
| KR | 1020200140966 A | 12/2020 | | |
| KR | 20210008265 A * | 1/2021 | ......... | H10K 59/8792 |
| KR | 1020210008265 A | 1/2021 | | |
| KR | 1020210069050 A | 6/2021 | | |

* cited by examiner

F I G. 4
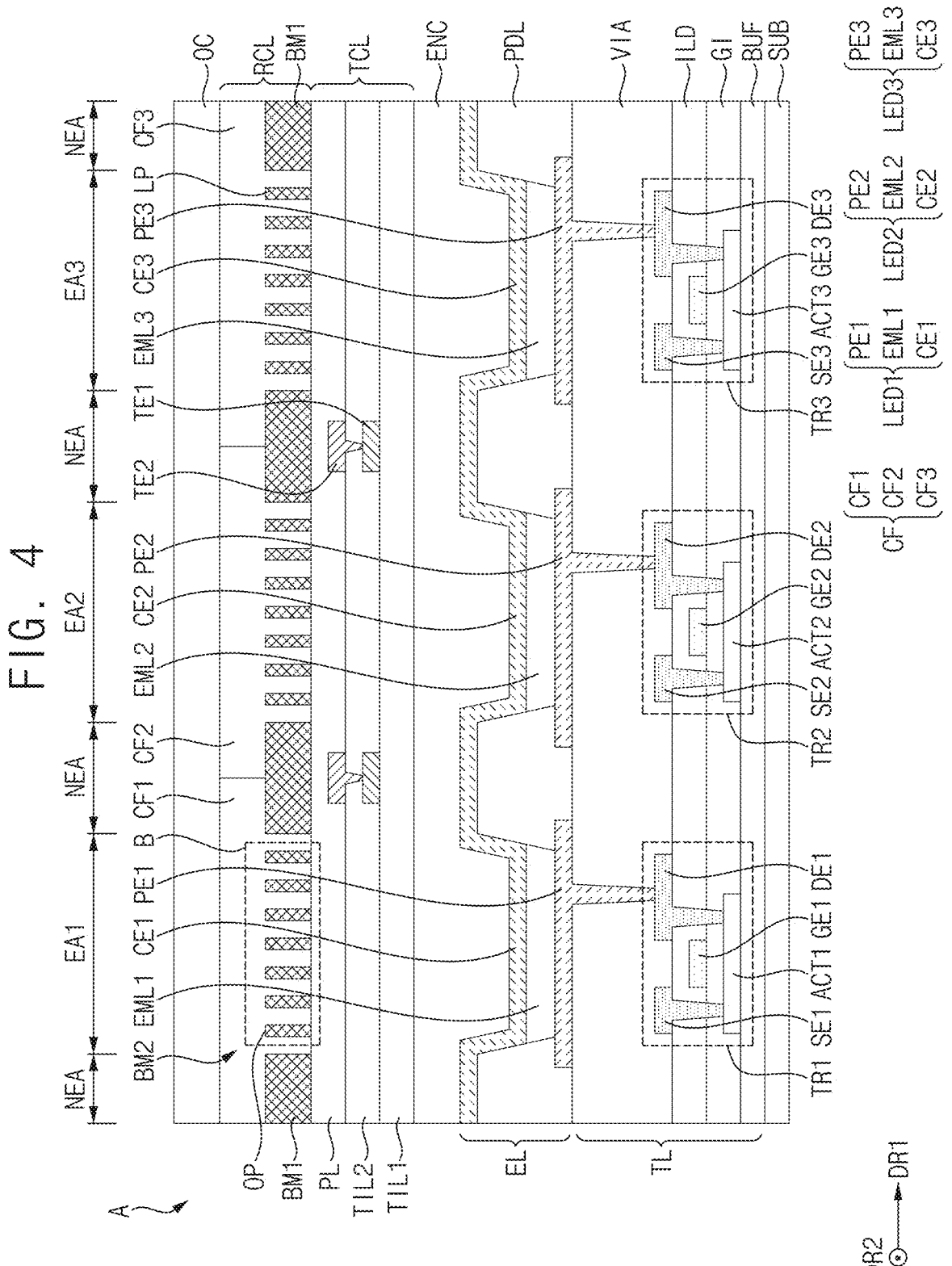

F I G. 22
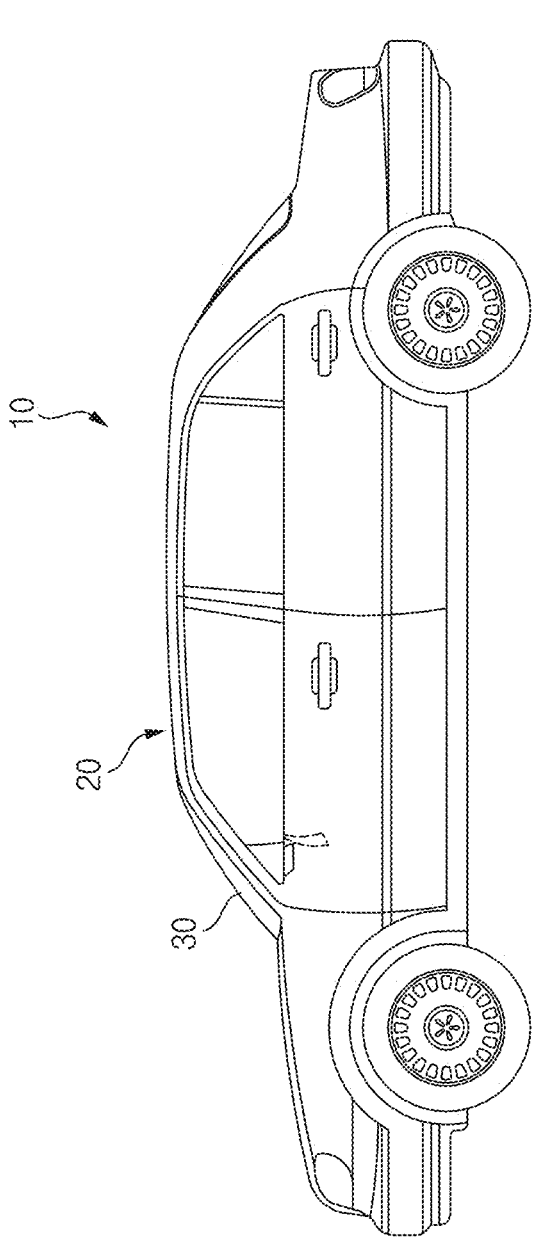

DISPLAY DEVICE

This application claims priority to Korean Patent Application No. 10-2022-0134246, filed on Oct. 18, 2022, and all the benefits accruing therefrom under 35 U.S.C. § 119, the content of which in its entirety is herein incorporated by reference.

BACKGROUND

1. Field

Embodiments provide generally to display device. More particularly, embodiments relate to a display device that provides visual information.

2. Description of the Related Art

With the development of information technology, the importance of a display device, which is a connection medium between a user and information, has been highlighted. For example, various types of display device such as liquid crystal display device, organic light emitting display device, plasma display device, or the like are widely used in various fields.

Such a display device may display an image having a wide viewing angle, or a viewing angle of an image displayed on the display device may be limited to improve security or image reflection.

SUMMARY

Embodiments provide a display device capable of effectively limiting a viewing angle.

A display device according to embodiments of the disclosure includes a substrate including a light emitting area and a non-light emitting area adjacent to the light emitting area, a light emitting element disposed in the light emitting area on the substrate, an encapsulation layer disposed on the light emitting element, a first light blocking layer disposed in the non-light emitting area on the encapsulation layer, a second light blocking layer disposed in the light emitting area on the encapsulation layer, where the second light blocking layer includes a same material as the first light blocking layer, and a plurality of openings is defined through the second light blocking layer, and a color filter layer disposed on the first light blocking layer and the second light blocking layer.

In an embodiment, an upper surface of the second light blocking layer may be positioned at a same level as an upper surface of the first light blocking layer with respect to the substrate.

In an embodiment, an upper surface of the second light blocking layer may be positioned at a level lower than an upper surface of the first light blocking layer with respect to the substrate.

In an embodiment, the display device may further include a low reflection coating layer surrounding at least a portion of the second light blocking layer and including a metal material.

In an embodiment, the first light blocking layer may include an inorganic material or an organic material including at least one selected from a black pigment and a black dye.

In an embodiment, the display device may further include a color conversion layer disposed to fill the openings of the second light blocking layer and including a base resin and quantum dots dispersed in the base resin.

In an embodiment, the color conversion layer may further include scattering particles dispersed in the base resin.

In an embodiment, the display device may further include a scattering layer disposed under or on the color conversion layer and including a base resin and scattering particles dispersed in the base resin of the scattering layer.

In an embodiment, the display device may further include a touch sensing layer including: a first touch insulating layer disposed on the encapsulating layer, a first touch electrode disposed on the first touch insulating layer, a second touch insulating layer disposed on the first touch insulating layer and the first touch electrode, a second touch electrode disposed on the second touch insulating layer and connected to the first touch electrode through a contact hole defined in the second touch insulating layer, and a protective layer disposed on the second touch insulating layer and the second touch electrode. In such an embodiment, an opening overlapping the light emitting area may be defined in each of the second touch insulating layer and the protective layer, and the second light blocking layer may be disposed in the opening of each of the second touch insulating layer and the protective layer.

In an embodiment, an upper surface of the second light blocking layer may be positioned at a same level as an upper surface of the first light blocking layer with respect to the substrate.

In an embodiment, a thickness of the second light blocking layer may be greater than a thickness of the first light blocking layer.

In an embodiment, an upper surface of the second light blocking layer may be positioned at a level lower than an upper surface of the first light blocking layer with respect to the substrate.

In an embodiment, a thickness of the second light blocking layer may be equal to a thickness of the first light blocking layer.

In an embodiment, the display device may further include a first organic film disposed in the non-light emitting area on the color filter layer and a second organic film disposed in the light emitting area and the non-light emitting area on the color filter layer and having a refractive index higher than a refractive index of the first organic film.

In an embodiment, a side surface of the first organic film may have a tapered cross-sectional shape.

In an embodiment, a taper angle of the first organic film may be in a range of about 70 degrees to about 85 degrees.

In an embodiment, the second light blocking layer may include a plurality of linear patterns or a plurality of non-linear patterns, or the second light blocking layer may have a mash shape or a zigzag shape in a plan view.

A display device according to embodiments of the disclosure includes a substrate including first, second, and third light emitting areas and a non-light emitting area adjacent to the first, second, and third light emitting areas, a light emitting element disposed in each of the first, second, and third light emitting areas on the substrate, an encapsulation layer disposed on the light emitting element, a first light blocking layer disposed in the non-light emitting area on the encapsulation layer, a second light blocking layer disposed in each of the first, second, and third light emitting areas on the encapsulation layer, where the second light blocking layer includes a same material as the first light blocking layer, an upper surface of the second light blocking layer is positioned at a lower level than an upper surface of the first light blocking layer with respect to the substrate, and a plurality of openings is defined through the second light blocking layer, and a color filter layer disposed on the first light blocking layer and the second light blocking layer.

In an embodiment, the display device may further include a first color conversion layer disposed to fill the openings of the second light blocking layer and overlapping the first light emitting area, where the first color conversion layer may include a first base resin and first quantum dots dispersed in the first base resin, a second color conversion layer disposed to fill the openings of the second light blocking layer and overlapping the second light emitting area, where the second color conversion layer may include a second base resin and second quantum dots dispersed in the second base resin, and a transmission layer disposed to fill the openings of the second light blocking layer and overlapping the third light emitting area, where the transmission layer may include a third base resin and third scattering particles dispersed in the third base resin.

In an embodiment, the display device may further include a first scattering layer disposed below or above the first color conversion layer, where the first scattering layer may include a fourth base resin and first scattering particles dispersed in the fourth base resin and a second scattering layer disposed below or above the second color conversion layer, where the second scattering layer may include a fifth base resin and second scattering particles dispersed in the fifth base resin.

A display device according to an embodiment of the disclosure may include a second light blocking layer that controls a viewing angle and overlaps a light emitting area without including a separate light blocking film that controls the viewing angle. In such an embodiment, a plurality of openings is defined in the second light blocking layer, and the second light blocking layer may include a same material as a first light blocking layer overlapping a non-light emitting area. Accordingly, the viewing angle of the display device may be efficiently controlled. In addition, an overall thickness of the display device may be reduced, and a manufacturing cost of the display device may be reduced.

BRIEF DESCRIPTION OF THE DRAWINGS

Illustrative, non-limiting embodiments will be more clearly understood from the following detailed description in conjunction with the accompanying drawings.

FIG. 4 is an enlarged cross-sectional view of an example of area A of FIG. 2.

FIG. 22 is a schematic view of an automobile.

DETAILED DESCRIPTION

Figure 1:
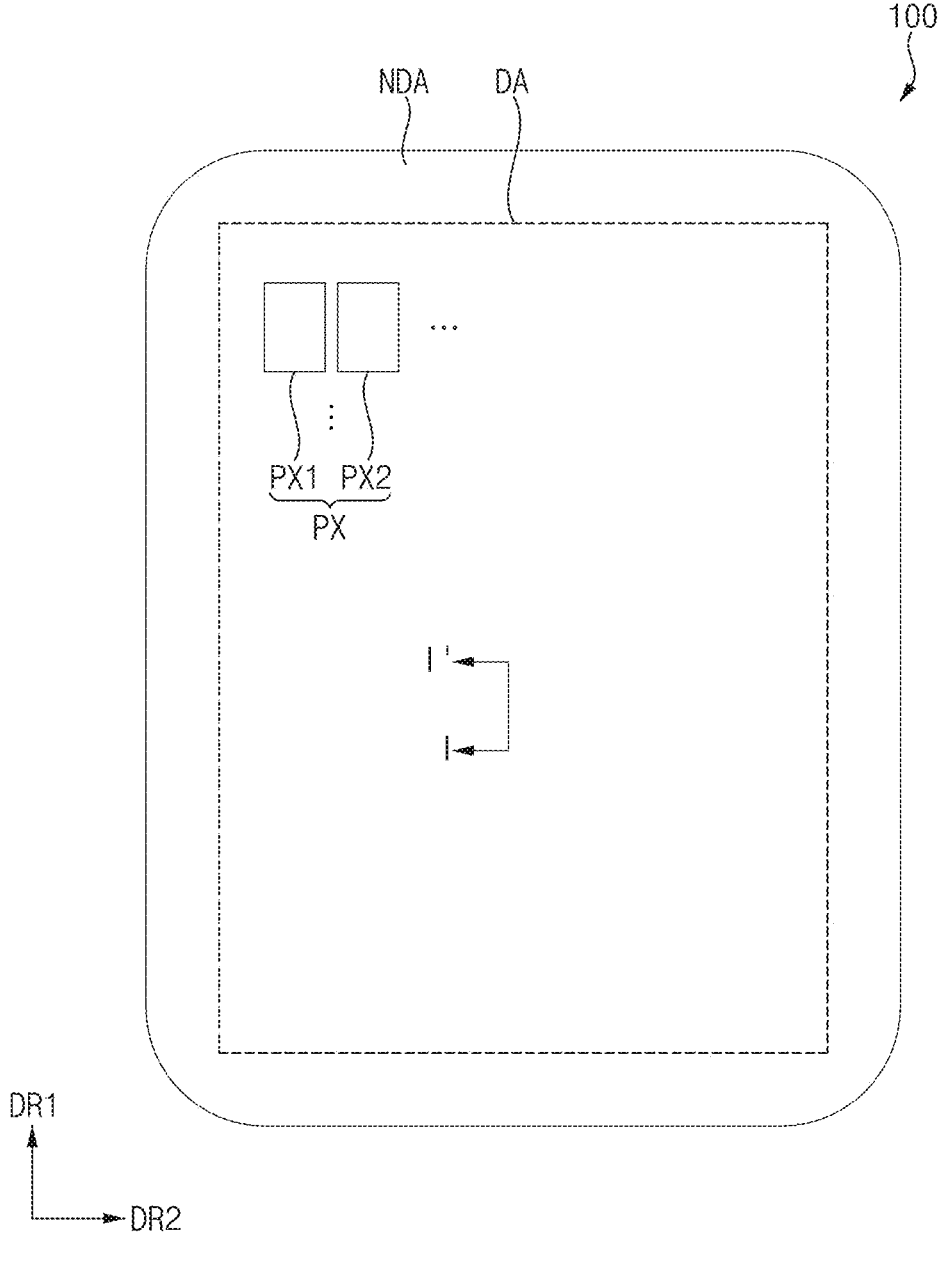
FIG. 1 is a plan view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a display device according to embodiments of the disclosure will be described in detail with reference to the accompanying drawings. The same reference numerals are used for the same components in the drawings, and redundant descriptions of the same components will be omitted.

FIG. 1 is a plan view illustrating a display device according to an embodiment of the disclosure.

Referring to FIG. 1, a display device 100 according to an embodiment of the disclosure may include a display area DA and a non-display area NDA.

A plurality of pixels PX may be disposed in the display area DA. Each of the plurality of pixels PX may emit light. The plurality of pixels PX may include a first pixel PX1 and a second pixel PX2. In an embodiment, for example, the first pixel PX1 and the second pixel PX2 may simultaneously emit light. Alternatively, when the first pixel PX1 emits light, the second pixel PX2 may not emit light. Alternatively, when the first pixel PX1 does not emit light, the second pixel PX2 may emit light. As each of the plurality of pixels PX emits light, the display area DA may display an image.

The plurality of pixels PX may be repeatedly arranged along a first direction DR1 and a second direction DR2 crossing the first direction DR1 in a plan view. In an embodiment, for example, the second pixel PX2 may be adjacent to the first pixel PX1. Specifically, the second pixel PX2 may be adjacent to the first pixel PX1 in the second direction DR2.

The non-display area NDA may be positioned around the display area DA. In an embodiment, for example, the non-display area NDA may surround at least a portion of the display area DA. A driver may be disposed in the non-display area NDA. The driver may provide signals and/or voltages to the plurality of pixels PX. In an embodiment, for example, the driver may include a data driver and a gate driver. The non-display area NDA may not display an image.

In this specification, a plane may be defined as the first direction DR1 and the second direction DR2. In an embodiment, for example, the first direction DR1 may be perpendicular to the second direction DR2.

The display device 100 of the disclosure may be an organic light emitting display device ("OLED"), a liquid crystal display device ("LCD"), a field emission display device ("FED"), a plasma display device ("PDP"), an electrophoretic display device ("EPD"), or an inorganic light emitting display device ("ILED").

Figure 2:
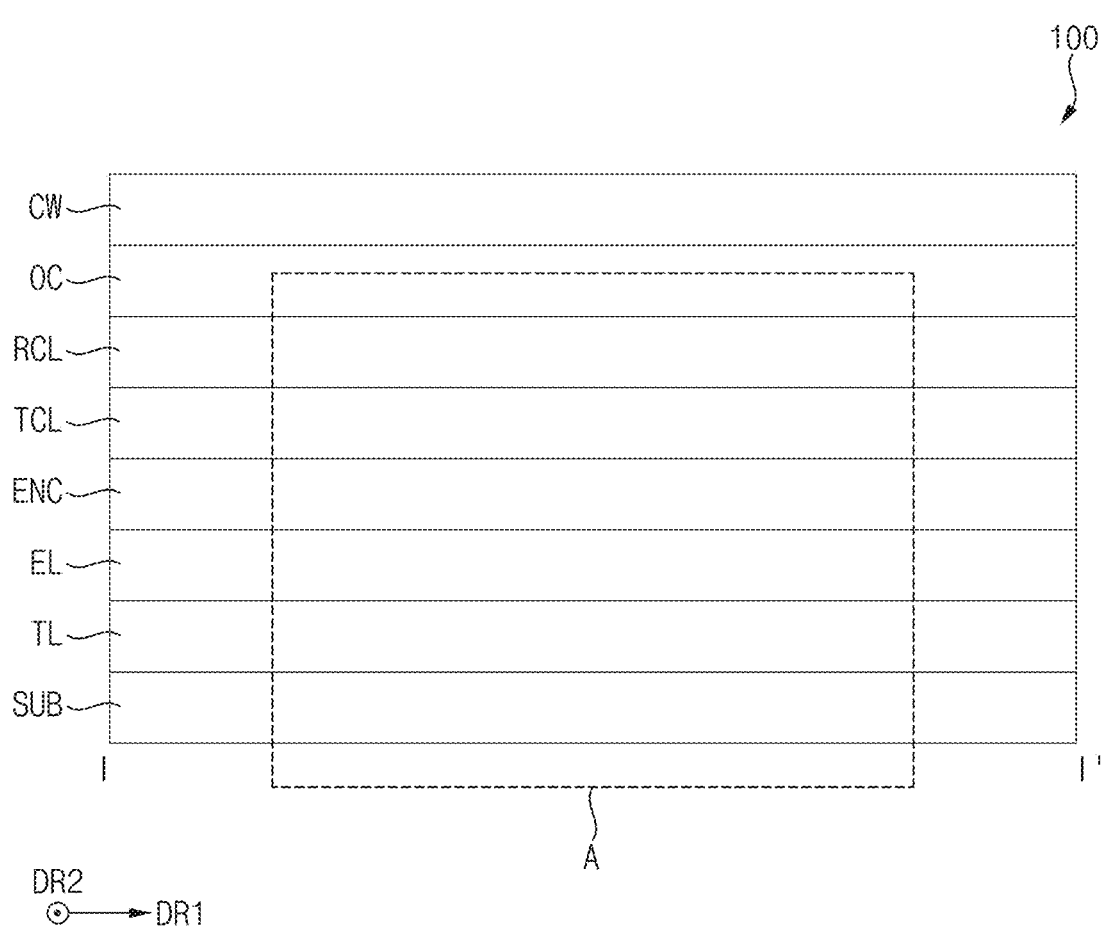
FIG. 2 is a cross-sectional view taken along line I-I' of FIG. 1.

FIG. 2 is a cross-sectional view taken along line I-I' of FIG. 1.

Referring to FIG. 2, the display device 100 according to an embodiment of the disclosure may include a substrate SUB, a transistor layer TL, a display element layer EL, an encapsulation layer ENC, a touch sensing layer TCL, an antireflection layer RCL, an overcoat layer OC, and a cover window CW.

The substrate SUB may include a transparent material or an opaque material. The substrate SUB may include or be made of a transparent resin substrate. In an embodiment, the transparent resin substrate include a polyimide substrate or the like, for example. In such an embodiment, the polyimide substrate may include a first organic layer, a first barrier layer, and a second organic layer. Alternatively, the substrate SUB may include a quartz substrate, a synthetic quartz substrate, a calcium fluoride substrate, an F-doped quartz substrate, a soda-lime glass substrate, a non-alkali glass substrate, or the like. These may be used alone or in combination with each other.

The transistor layer TL may be disposed on the substrate SUB. In an embodiment, for example, the transistor layer TL may include an insulating layer, a transistor, or the like. Detailed features of the transistor layer TL will be described later.

The display element layer EL may be disposed on the transistor layer TL. The display element layer EL may include a light emitting element that emits light. Detailed features of the display element layer EL will be described later.

The encapsulation layer ENC may be disposed on the display element layer EL. The encapsulation layer ENC may prevent impurities, moisture, or the like from penetrating into the display element layer EL from the outside. Detailed features of the encapsulation layer ENC will be described later.

The touch sensing layer TCL may be disposed on the encapsulation layer ENC. The touch sensing layer TCL may function as an input unit of the display device 100. Detailed features of the touch sensing layer TCL will be described later.

The anti-reflection layer RCL may be disposed on the touch sensing layer TCL. The anti-reflection layer RCL may reduce the reflectance of the display device 100 by external light. Detailed features of the antireflection layer RCL will be described later.

The overcoat layer OC may be disposed on the anti-reflection layer RCL. The overcoat layer OC may prevent the anti-reflection layer RCL from being exposed to external moisture or air.

The cover window CW may be disposed on the overcoat layer OC. The cover window CW may serve to protect the substrate SUB, the transistor layer TL, the display element layer EL, the encapsulation layer ENC, and the touch sensing layer TCL. In an embodiment, for example, the cover window CW may include polyimide or ultra-thin glass.

Figure 3:
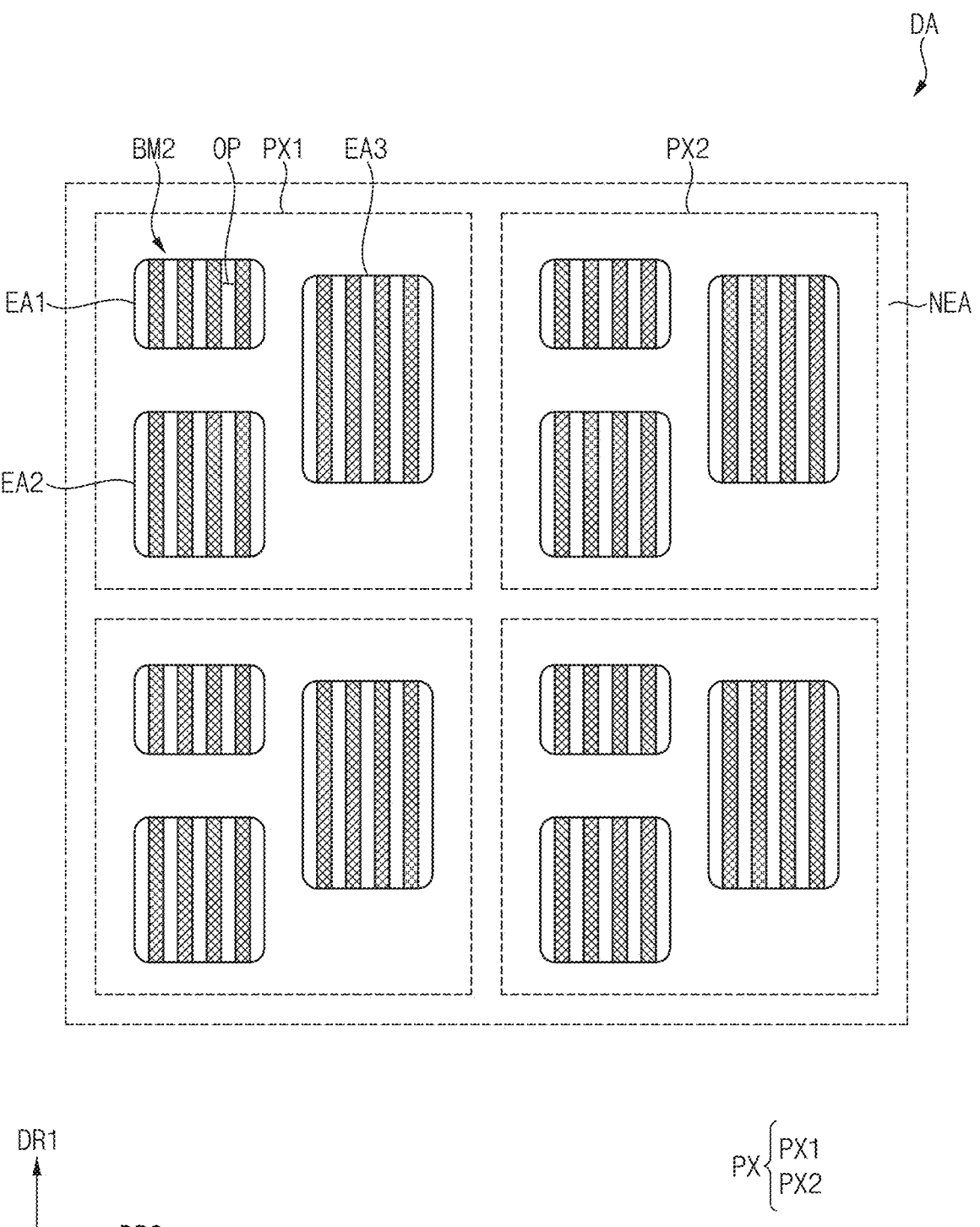
FIG. 3 is an enlarged plan view of an example of a display area of the display device of FIG. 1.

FIG. 3 is an enlarged plan view of an example of a display area of the display device of FIG. 1.

Referring to FIG. 3, as described above, an embodiment of the display device 100 may include the display area DA and the non-display area NDA, and the plurality of pixels PX may be disposed in the display area DA. The plurality of pixels PX may include the first pixel PX1 and the second pixel PX2.

Each of the first pixel PX1 and the second pixel PX2 may include a first light emitting area EA1, a second light emitting area EA2, a third light emitting area EA3, and a non-light emitting area NEA.

The first light emitting area EA1 may emit light of a first color, the second light emitting area EA2 may emit light of a second color, and the third light emitting area EA3 may emit light of a third color. In an embodiment, the first color may be red, the second color may be green, and the third color may be blue. The non-light emitting area NEA may not emit light. However, the disclosure is not limited thereto, and the first, second, and third colors may have various colors.

In an embodiment, the display device 100 may include a second light blocking layer BM2 disposed in each of the first, second, and third light emitting areas EA1, EA2, and EA3. A plurality of openings OP may be defined in the second light blocking layer BM2. In an embodiment, for example, the second light blocking layer BM2 may include a plurality of linear patterns LP (see FIG. 4) each extending in the first direction DR1 and arranged along the second direction DR2. In such an embodiment, each of the openings OP may extend in the first direction DR1 and arranged along the second direction DR2.

Figure 5:
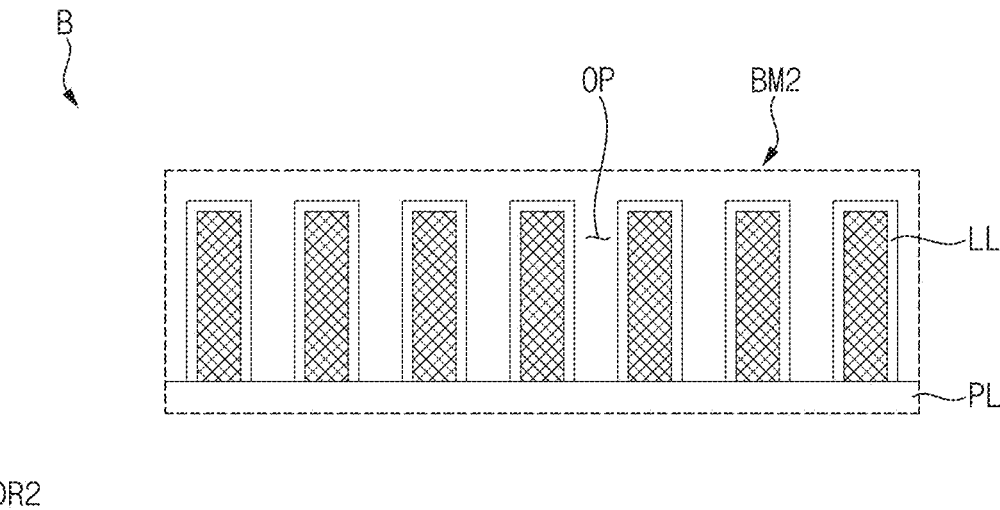
FIG. 5 is an enlarged cross-sectional view of area B of FIG. 4.
Figure 6:
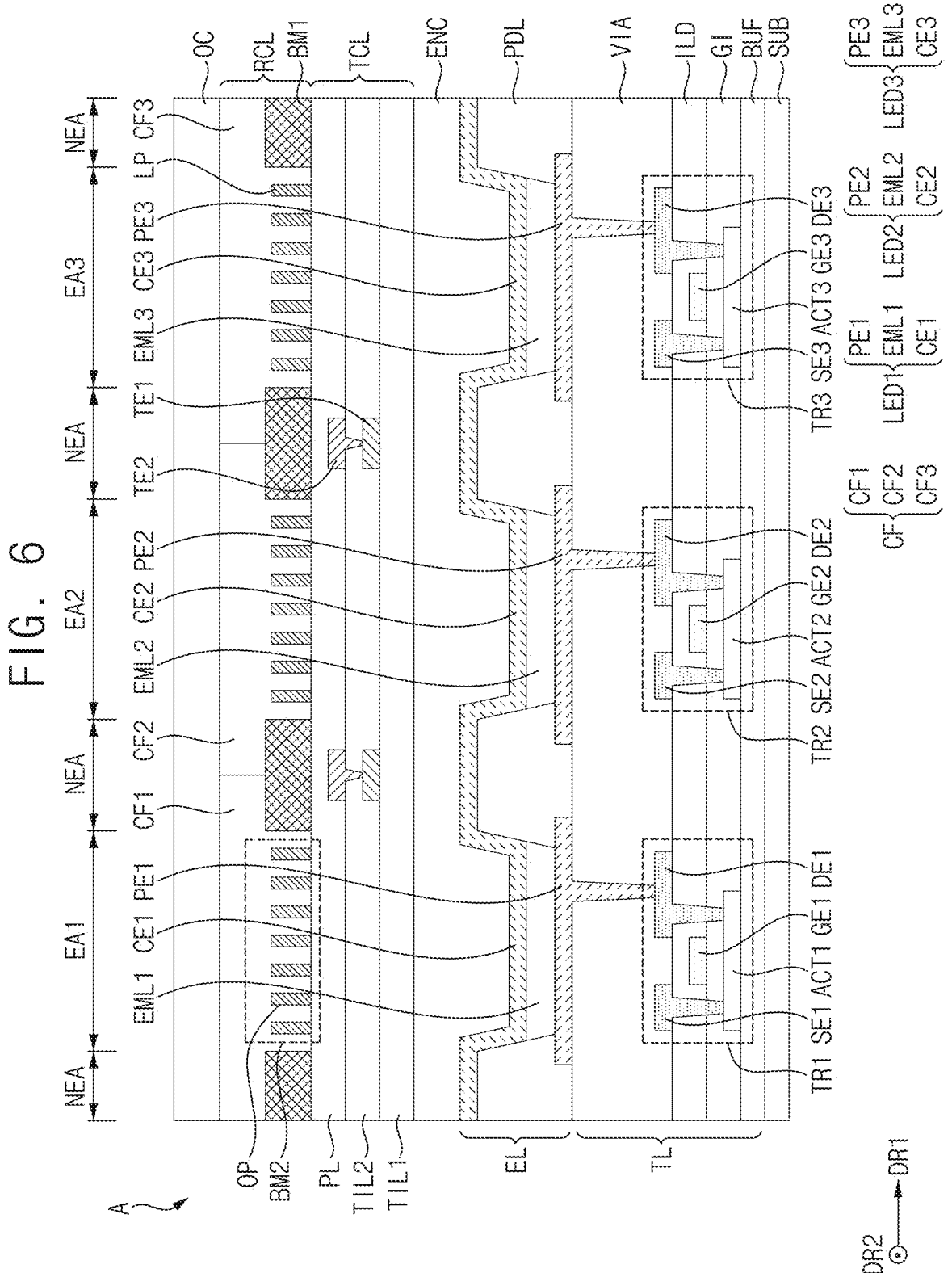
FIG. 6 is an enlarged cross-sectional view of another example of area A of FIG. 2.

FIG. 4 is an enlarged cross-sectional view of an example of area A of FIG. 2. FIG. 5 is an enlarged cross-sectional view of area B of FIG. 4. FIG. 6 is an enlarged cross-sectional view of another example of area A of FIG. 2.

Referring to FIGS. 2, 3, and 4, the display device 100 according to an embodiment may include the substrate SUB, the transistor layer TL, the display element layer EL, the encapsulation layer ENC, the touch sensing layer TCL, the anti-reflection layer RCL, the overcoat layer OC, and the cover window CW.

In an embodiment, the transistor layer TL may include a buffer layer BUF, first, second, and third transistors TR1, TR2, and TR3, a gate insulating layer GI, an interlayer insulating layer ILD, and a via insulating layer VIA. The display element layer EL may include a pixel defining layer PDL and first, second, and third light emitting elements LED1, LED2, and LED3. The touch sensing layer TCL may include a first touch insulating layer TIL1, a second touch insulating layer TIL2, a first touch electrode TE1, a second touch electrode TE2, and a protective layer PL. The anti-reflection layer RCL may include a first light blocking layer BM1, the second light blocking layer BM2, and a color filter layer CF.

In addition, the first transistor TR1 may include a first active pattern ACT1, a first gate electrode GE1, a first source electrode SE1 and a first drain electrode DE1, the second transistor TR2 may include a second active pattern ACT2, a second gate electrode GE2, a second source electrode SE2, and a second drain electrode DE2, and the third transistor TR3 may include a third active pattern ACT3, a third gate electrode GE3, a third source electrode SE3, and a third drain electrode DE3.

In addition, the first light emitting element LED1 may include a first pixel electrode PE1, a first light emitting layer EML1, and a first common electrode CE1, the second light emitting element LED2 may include a second pixel electrode PE2, a second light emitting layer EML2, and a second common electrode CE2, and the third light emitting element LED3 may include a third pixel electrode PE3, a third light emitting layer EML3, and a third common electrode CE3.

As described above, each of the pixels PX of the display device 100 may include the first, second, and third light emitting areas EA1, EA2, and EA3 and the non-light emitting area NEA. As each of the pixels PX of the display device 100 includes the first, second, and third light emitting areas EA1, EA2, and EA3 and the non-light emitting area NEA, the substrate SUB may include the first, second, and third light emitting areas EA1, EA2, and EA3, and the non-light emitting area NEA.

The buffer layer BUF may be disposed on the substrate SUB. The buffer layer BUF may prevent diffusion of metal atoms or impurities from the substrate SUB into the first, second, and third transistors TR1, TR2, and TR3. In addition, the buffer layer BUF may improve flatness of the surface of the substrate SUB when the surface of the substrate SUB is not uniform. In an embodiment, for example, the buffer layer BUF may include an inorganic material such as silicon oxide, silicon nitride, silicon oxynitride, or the like. These may be used alone or in combination with each other.

The first, second, and third active patterns ACT1, ACT2, and ACT3 may be disposed on the buffer layer BUF. Each of the first, second, and third active patterns ACT1, ACT2, and ACT3 may include a metal oxide semiconductor, an inorganic semiconductor (e.g., amorphous silicon, poly silicon), or an organic semiconductor. Each of the first, second, and third active patterns ACT1, ACT2, and ACT3 may include a source region, a drain region, and a channel region positioned between the source region and the drain region. The first, second, and third active patterns ACT1, ACT2, and ACT3 may be formed through a same process as each other and include a same material as each other.

The metal oxide semiconductor may include a two-component compound ($AB_x$), a ternary compound ($AB_xC_y$), a four-component compound ($AB_xC_yD_z$), and the like containing indium (In), zinc (Zn), gallium (Ga), tin (Sn), titanium (Ti), aluminum (Al), hafnium (Hf), zirconium (Zr), magnesium (Mg), or the like. In an embodiment, for example, the metal oxide semiconductor may include zinc oxide ($ZnO_x$), gallium oxide ($GaO_x$"), tin oxide ($SnO_x$), indium oxide ($InO_x$), indium gallium oxide ("IGO"), indium zinc oxide ("IZO"), indium tin oxide ("ITO"), indium zinc tin oxide ("IZTO"), indium gallium zinc oxide ("IGZO"), or the like. These may be used alone or in combination with each other.

The gate insulating layer GI may be disposed on the buffer layer BUF. The gate insulating layer GI may sufficiently cover the first, second, and third active patterns ACT1, ACT2, and ACT3, and may have a substantially flat upper surface without creating a step around the first, second, and third active patterns ACT1, ACT2, and ACT3. Alternatively, the gate insulating layer GI may cover the first, second, and third active patterns ACT1, ACT2, and ACT3 and may be disposed along a profile of each of the first, second, and third active patterns ACT1, ACT2, and ACT3 to have a uniform thickness. In an embodiment, for example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in combination with each other.

The first, second, and third gate electrodes GE1, GE2, and GE3 may be disposed on the gate insulating layer GI. The first gate electrode GE1 may overlap the channel region of the first active pattern ACT1, the second gate electrode GE2 may overlap the channel region of the second active pattern ACT2, and the third gate electrode GE3 may overlap the channel region of the third active pattern ACT3.

The each of the first, second, and third gate electrodes GE1, GE2, and GE3 may include a metal, an alloy, a metal nitride, a conductive metal oxide, a transparent conductive material, or the like. In such an embodiment, the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like, for example. In such an embodiment, the conductive metal oxide include indium tin oxide and indium zinc oxide. In addition, examples of the metal nitride may include aluminum nitride ("$AlN_x$"), tungsten nitride ("$WN_x$"), chromium nitride ("$CrN_x$"), or the like, for example. These may be used individually or in combination with each other.

The first, second, and third gate electrodes GE1, GE2, and GE3 may be formed through a same process as each other and include a same material as each other.

The interlayer insulating layer ILD may be disposed on the gate insulating layer GI. The interlayer insulating layer ILD may sufficiently cover the first, second, and third gate electrodes GE1, GE2, and GE3 and may have a substantially flat upper surface without creating a step around the first, second, and third gate electrodes GE1, GE2, and GE3. Alternatively, the interlayer insulating layer ILD may cover the first, second, and third gate electrodes GE1, GE2, and GE3 and may be disposed along the profile of each of the first, second, and third gate electrodes GE1, GE2, and GE3 to have a uniform thickness. In an embodiment, for example, the interlayer insulating layer ILD may include an inorganic material such as silicon oxide, silicon nitride, silicon carbide, silicon oxynitride, silicon oxycarbide, or the like. These may be used alone or in combination with each other.

The first, second, and third source electrodes SE1, SE2, and SE3 may be disposed on the interlayer insulating layer ILD. The first source electrode SE1 may be connected to the source region of the first active pattern ACT1 through a contact hole defined or formed through the gate insulating layer GI and the interlayer insulating layer ILD. The second source electrode SE2 may be connected to the source region of the second active pattern ACT2 through a contact hole defined or formed through the gate insulating layer GI and the interlayer insulating layer ILD. The third source electrode SE3 may be connected to the source region of the third active pattern ACT3 through a contact hole defined or formed through the gate insulating layer GI and the interlayer insulating layer ILD.

The first, second, and third drain electrodes DE1, DE2, and DE3 may be disposed on the interlayer insulating layer ILD. The first drain electrode DE1 may be connected to the drain region of the first active pattern ACT1 through a contact hole defined or formed through the gate insulating layer GI and the interlayer insulating layer ILD. The second drain electrode DE2 may be connected to the drain region of the second active pattern ACT2 through a contact hole defined or formed through the gate insulating layer GI and the interlayer insulating layer ILD. The third drain electrode DE3 may be connected to the drain region of the third active pattern ACT3 through a contact hole defined or formed through the gate insulating layer GI and the interlayer insulating layer ILD.

In an embodiment, for example, each of the first, second, and third source electrodes SE1, SE2, and SE3 may include a metal, an alloy, a metal nitride, a conductive metal oxide, a transparent conductive material, or the like. These may be used alone or in combination with each other. The first, second, and third drain electrodes DE1, DE2, and DE3 may be formed through a same process as the first, second, and third source electrodes SE1, SE2, and SE3 and may include a same material as the first, second, and third source electrodes SE1, SE2, and SE3.

Accordingly, the first transistor TR1 including the first active pattern ACT1, the first gate electrode GE1, the first source electrode SE1, and the first drain electrode DE1 may be disposed on the substrate SUB. The second transistor TR2 including the second active pattern ACT2, the second gate electrode GE2, the second source electrode SE2, and the second drain electrode DE2 may be disposed on the substrate SUB. The third transistor TR3 including the third active pattern ACT3, the third gate electrode GE3, the third source electrode SE3, and the third drain electrode DE3 may be disposed on the substrate SUB.

The via insulating layer VIA may be disposed on the interlayer insulation layer ILD. The via insulating layer VIA may sufficiently cover the first, second, and third source electrodes SE1, SE2, and SE3 and the first, second, and third drain electrodes DE1, DE2, and DE3. The via insulating layer VIA may include an organic material. In an embodiment, for example, the via insulating layer VIA may include or be made of phenolic resin, polyacrylates resin, polyimides rein, polyamides resin, siloxane resin, epoxy resin, or the like. These may be used alone or in combination with each other.

The first, second, and third pixel electrodes PE1, PE2, and PE3 may be disposed on the via insulating layer VIA. The first pixel electrode PE1 may overlap the first light emitting area EA1, the second pixel electrode PE2 may overlap the second light emitting area EA2, and the third pixel electrode PE3 may overlap the third light emitting area EA3.

The first pixel electrode PE1 may be connected to the first drain electrode DE1 through a contact hole defined or formed through the via insulating layer VIA, and the second pixel electrode PE2 may be connected to the second drain electrode DE2 through a contact hole defined or formed through the via insulating layer VIA. In addition, the third pixel electrode PE3 may be connected to the third drain electrode DE3 through a contact hole defined or formed through the via insulating layer VIA.

In an embodiment, for example, each of the first, second, and third pixel electrodes PE1, PE2, and PE3 may include a metal, an alloy, a metal nitride, a conductive metal oxide, a transparent conductive material, or the like. These may be used alone or in combination with each other. In an embodiment, each of the first, second, and third pixel electrodes PE1, PE2, and PE3 may have a stacked structure including ITO/Ag/ITO. The first, second, and third pixel electrodes PE1, PE2, and PE3 may be formed through a same process as each other and include a same material as each other. In an embodiment, for example, each of the first, second, and third pixel electrodes PE1, PE2, and PE3 may function as an anode.

The pixel defining layer PDL may be disposed on the via insulating layer VIA. The pixel defining layer PDL may overlap the non-light emitting area NEA. The pixel defining layer PDL may cover opposite sides of each of the first, second, and third pixel electrodes PE1, PE2, and PE3. In addition, an opening exposing a portion of an upper surface of each of the first, second, and third pixel electrodes PE1, PE2, and PE3 may be defined in the pixel defining layer PDL. In an embodiment, for example, the pixel defining layer PDL may include an inorganic material or an organic material. In an embodiment, the pixel defining layer PDL may include an organic material such as an epoxy resin, a siloxane resin, or the like. These may be used alone or in combination with each other. In an alternative embodiment, the pixel defining layer PDL may further include a light blocking material containing a black pigment or black dye.

The first light emitting layer EML1 may be disposed on the first pixel electrode PE1, the second light emitting layer EML2 may be disposed on the second pixel electrode PE2, and the third light emitting layer EML3 may be disposed on the third pixel electrode PE3. Each of the first, second, and third light emitting layers EML1, EML2, and EML3 may include an organic material emitting light of a predetermined color. In an embodiment, for example, the first light emitting layer EML1 may include an organic material that emits red light, the second light emitting layer EML2 may include an organic material that emits green light, and the third light emitting layer EML3 may include an organic material that emits blue light. However, the configuration of the disclosure is not limited thereto.

The first common electrode CE1 may be disposed on the first light emitting layer EML1 and the pixel defining layer PDL, the second common electrode CE2 may be disposed on the second light emitting layer EML2 and the pixel defining layer PDL, and the third common electrode CE3 may be disposed on the third light emitting layer EML3 and the pixel defining layer PDL. The first, second, and third common electrodes CE1, CE2, and CE3 may be integrally formed with each other as a single unitary and indivisible part. In an embodiment, for example, each of the first, second, and third common electrodes CE1, CE2, and CE3 may include a metal, an alloy, a metal nitride, a conductive metal oxide, a transparent conductive material, or the like. These may be used alone or in combination with each other. The first, second, and third common electrodes CE1, CE2, and CE3 may operate as cathodes.

Accordingly, the first light emitting element LED1 including the first pixel electrode PE1, the first light emitting layer EML1, and the first common electrode CE1 may be disposed in the first light emitting area EA1 on the substrate SUB. The second light emitting element LED2 including the second pixel electrode PE2, the second light emitting layer EML2, and the second common electrode CE2 may be disposed in the second light emitting area EA2 on the substrate SUB. The third light emitting element LED3 including the third pixel electrode PE3, the third light emitting layer EML3, and the third common electrode CE3 may be disposed in the third light emitting area EA3 on the substrate SUB.

The encapsulation layer ENC may be disposed on the first, second, and third common electrodes CE1, CE2, and CE3. The encapsulation layer ENC may prevent impurities, moisture, air, and the like from permeating into the first, second, and third light emitting elements LED1, LED2, and LED3 from the outside. The encapsulation layer ENC may include at least one inorganic layer and at least one organic layer. In an embodiment, for example, the inorganic layer may include silicon oxide, silicon nitride, silicon oxynitride, or the like. These may be used alone or in combination with each other. The organic layer may include a polymer cured material such as polyacrylate, or the like.

The touch sensing layer TCL may be disposed on the encapsulation layer ENC. The touch sensing layer TCL may function as an input unit of the display device 100. In an embodiment, as described above, the touch sensing layer TCL may include the first touch insulating layer ILL the second touch insulating layer IL2, the first touch electrode TE1, the second touch electrode TE2, and the protective layer PL.

The first touch insulating layer TIL1 may be disposed on the encapsulation layer ENC. The first touch insulating layer TIL1 may include an inorganic material or an organic material. In an embodiment, for example, the first touch insulating layer TIL1 may include an inorganic material such as silicon oxide, silicon nitride, or the like. These may be used alone or in combination with each other.

The first touch electrode TE1 may be disposed on the first touch insulating layer TL1. The first touch electrode TE1 may overlap the non-light emitting area NEA. In an embodiment, for example, the first touch electrode TE1 may include a metal, an alloy, a metal nitride, a conductive metal oxide, a transparent conductive material, or the like. These may be used alone or in combination with each other.

The second touch insulating layer TIL2 may be disposed on the first touch insulating layer TIL1 and the first touch electrode TE1. The second touch insulating layer TIL2 may sufficiently cover the first touch electrode TE1. The second touch insulating layer TIL2 may include an inorganic material or an organic material. In an embodiment, for example, the second touch insulating layer TIL2 may include an inorganic material such as silicon oxide, silicon nitride, or the like. These may be used alone or in combination with each other.

The second touch electrode TE2 may be disposed on the second touch insulating layer TIL2. The second touch electrode TE2 may overlap the non-light emitting area NEA. The second touch electrode TE2 may be connected to the first touch electrode TE1 through a contact hole passing through the second touch insulating layer TL2. In an embodiment, for example, the second touch electrode TE2 may include carbon nano tube ("CNT"), transparent conductive oxide, ITO, IGZO, zinc oxide (ZnO), graphene, silver nanowire ("AgNW"), copper (Cu), chromium (Cr), or the like. These may be used alone or in combination with each other.

The first touch electrode TE1 and the second touch electrode TE2 may include a same material as each other. Alternatively, the first touch electrode TE1 and the second touch electrode TE2 may include different materials from each other.

The protective layer PL may be disposed on the second touch insulating layer TIL2 and the second touch electrode TE2. The protective layer PL may sufficiently cover the second touch electrode TE2. The protective layer PL may protect the first touch electrode TE1 and the second touch electrode TE2. The protective layer PL may include an inorganic material or an organic material. In an embodiment, for example, the protective layer PL may include an inorganic material such as silicon oxide, silicon nitride, or the like. These may be used alone or in combination with each other.

The first light blocking layer BM1 may be disposed on the protective layer PL. The first light blocking layer BM1 may overlap the non-light emitting area NEA. The first light blocking layer BM1 may block light incident to the first light blocking layer BM1. Accordingly, the first light blocking layer BM1 may effectively prevent color mixing between the first light emitting area EA1, the second light emitting area EA2, and the third light emitting area EA3. An opening overlapping each of the first light emitting area EA1, the second light emitting area EA2, and the third light emitting area EA3 may be defined in the first light blocking layer BM1. In an embodiment, for example, the first light blocking layer BM1 may include an organic material or an inorganic material including (or containing) black pigment, black dye, and/or the like.

The second light blocking layer BM2 may be disposed on the protective layer PL. A plurality of openings OP arranged along the first direction DR1 may be defined in the second light blocking layer BM2. That is, the second light blocking layer BM2 may form a slit structure. The second light blocking layer BM2 may overlap the first light emitting area EA1, the second light emitting area EA2, and the third light emitting area EA3. That is, the second light blocking layer BM2 may not overlap the non-light emitting area NEA.

The second light blocking layer BM2 may block light emitted from the first, second, and third light emitting elements LED1, LED2, and LED3 to control the viewing angle of the display device 100. In such an embodiment, among the lights emitted from the first, second, and third light emitting elements LED1, LED2, and LED3, light passing through the openings OP of the second light blocking layer BM2 may be emitted to the outside of the display device 100 and light incident to the second light blocking layer BM2 may be blocked.

The second light blocking layer BM2 may include a same material as the first light blocking layer BM1. That is, the second light blocking layer BM2 may be formed through a same process as the first light blocking layer BM1 and may be disposed on the same layer.

In an embodiment, as illustrated in FIG. 4, an upper surface of the second light blocking layer BM2 may be positioned at a same level as an upper surface of the first light blocking layer BM1 with respect to the substrate SUB. In such an embodiment, a thickness of the second light blocking layer BM2 may be equal to as a thickness of the first light blocking layer BM1. In an alternative embodiment, as illustrated in FIG. 6, the upper surface of the second light blocking layer BM2 may be positioned at a lower level than the upper surface of the first light blocking layer BM1 with respect to the substrate SUB. In such an embodiment, the thickness of the second light blocking layer BM2 may be less than the thickness of the first light blocking layer BM1.

An outer surface of the second light blocking layer BM2 may directly contact the color filter layer CF. However, the configuration of the disclosure is not limited thereto. In an embodiment, as illustrated in FIG. 5, the display device 100 may further include a low reflection coating layer LL surrounding at least a portion of the second light blocking layer BM2. In an embodiment, for example, the low reflection coating layer LL may include a metal material. However, the configuration of the disclosure is not limited thereto, and the low reflection coating layer LL may include various low reflection materials. Due to the low reflection coating layer LL, light incident on the second light blocking layer BM2 may be reflected without being blocked. Accordingly, light efficiency of the display device 100 may be improved.

The color filter layer CF may be disposed on the first light blocking layer BM1 and the second light blocking layer BM2. The color filter layer CF may selectively transmit only light of a specific wavelength and absorb light of other wavelengths. The color filter layer CF may include a first color filter CF1 partially overlapping the first light emitting area EA1, a second color filter CF2 partially overlapping the second light emitting area EA2, and a third color filter CF3 partially overlapping the third light emitting EA3.

The first color filter CF1 may selectively transmit light of a first color (e.g., red light) and absorb light of other colors. The second color filter CF2 may selectively transmit light of a second color (e.g., green light) and absorb light of other colors. The third color filter CF3 may selectively transmit light of a third color (e.g., blue light) and absorb light of other colors.

The overcoat layer OC may be disposed on the color filter layer CF. The overcoat layer OC may prevent the color filter layer CF from being exposed to external moisture or air. In addition, the overcoat layer OC may function as a planarization layer. In an embodiment, for example, the overcoat layer OC may include an organic material or an inorganic material.

According to a comparative example, a display device may include a separate light blocking film for controlling a viewing angle. In such a comparative example, an overall thickness of the display device may be relatively thick due to the light blocking film, and the viewing angle of the display device may not be efficiently controlled.

The display device 100 according to an embodiment of the disclosure may include the second light blocking layer BM2 that controls the viewing angle and overlaps the light emitting areas EA1, EA2, and EA3 without including the separate light blocking film that controls the viewing angle. The plurality of openings OP are defined in the second light blocking layer BM2, and the second light blocking layer BM2 may include a same material as the first light blocking layer BM1 overlapping the non-light emitting area NEA. Accordingly, the viewing angle of the display device 100 may be efficiently controlled. In addition, the overall thickness of the display device 100 may be reduced. In addition, a manufacturing cost of the display device 100 may be reduced.

FIGS. 7, 8, 9, 10, 11, and 12 are cross-sectional views for explaining a manufacturing method of the display device of FIG. 4.

Figure 7:
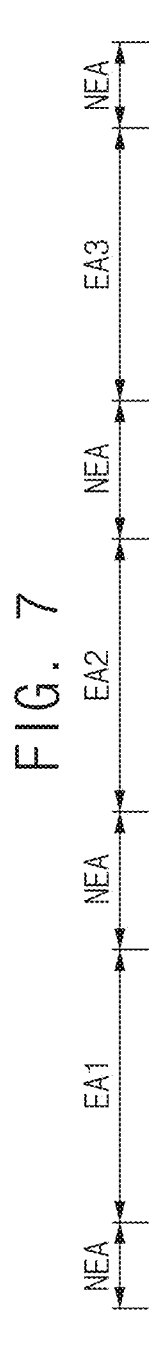
FIGS. 7, 8, 9, 10, 11, and 12 are cross-sectional views for explaining a manufacturing method of the display device of FIG. 4.
Figure 7:
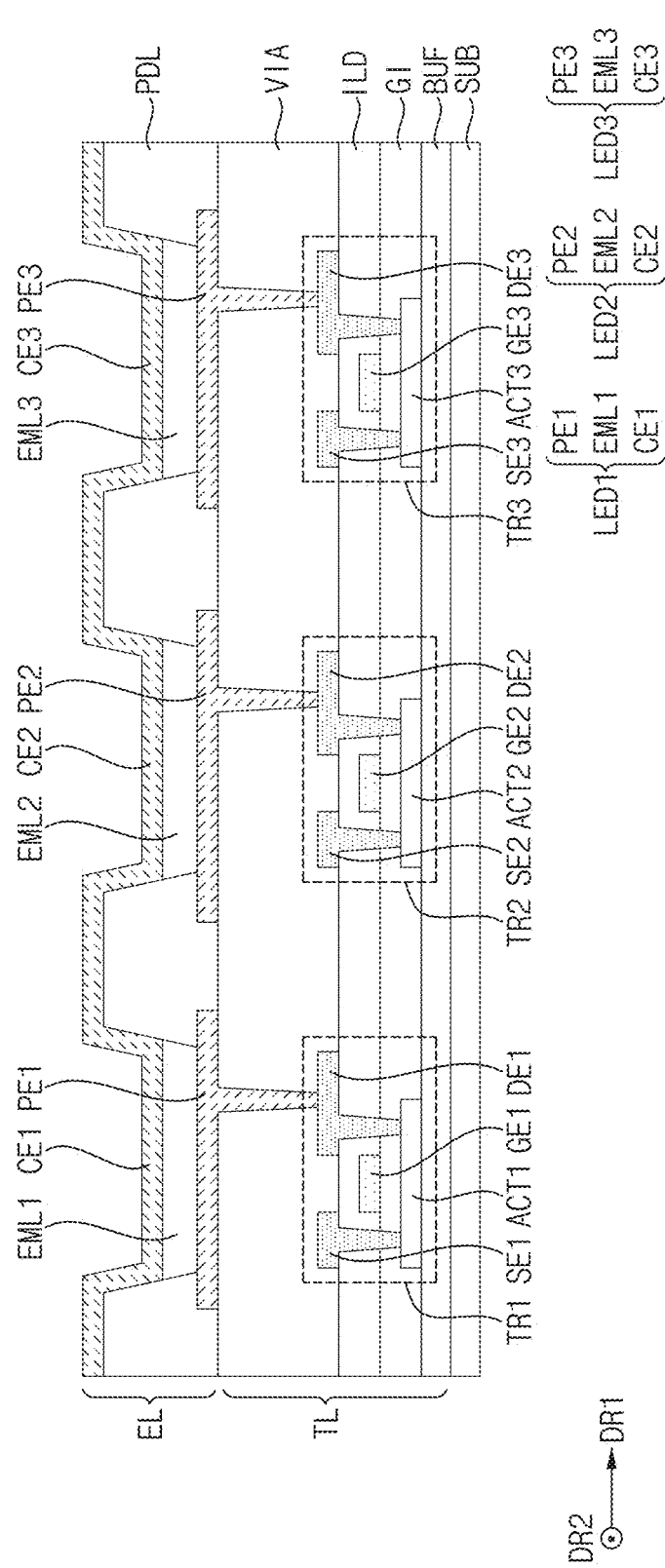

Referring to FIG. 7, in an embodiment of a manufacturing method of the display device, the buffer layer BUF, first, second, and third active patterns ACT1, ACT2, and ACT3, the gate insulating layer GI, the first, second, and third gate electrodes GE1, GE2, and GE3, the interlayer insulating layer ILD, the first, second, and third source electrodes SE1, SE2, and SE3, and the first, second, and third drain electrodes DE1, DE2, and DE3, the via insulating layer VIA, the first, second, and third pixel electrodes PE1, PE2, and PE3, the pixel defining layer PDL, the first, second, and third light emitting layers EML1, EML2, and EML3, and the first, second, and third common electrodes CE1, CE2, and CE3 may be sequentially provided or formed on the substrate SUB.

Figure 8:
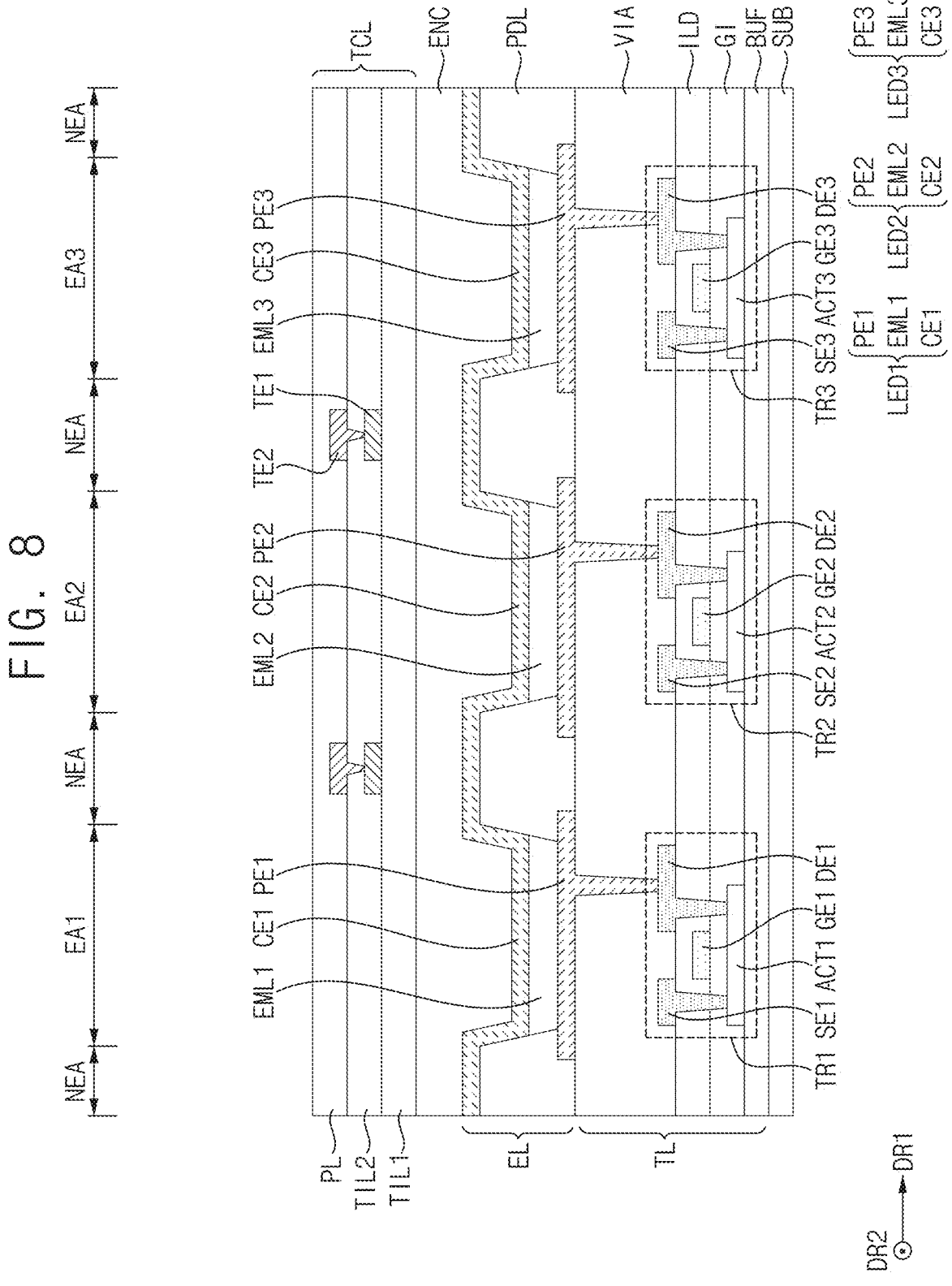

Referring to FIG. 8, the encapsulation layer ENC may be provided or formed on the first, second, and third common electrodes CE1, CE2, and CE3. The encapsulation layer ENC may include at least one inorganic layer and at least one organic layer.

The first touch insulating layer TILL the first touch electrode TE1, the second touch insulating layer TIL2, the second touch electrode TE2, and the protective layer PL may be sequentially formed on the encapsulation layer ENC. The second touch electrode TE2 may be connected to the first touch electrode TE1 through a contact hole formed by removing a portion of the second touch insulating layer TIL2.

Figure 9:
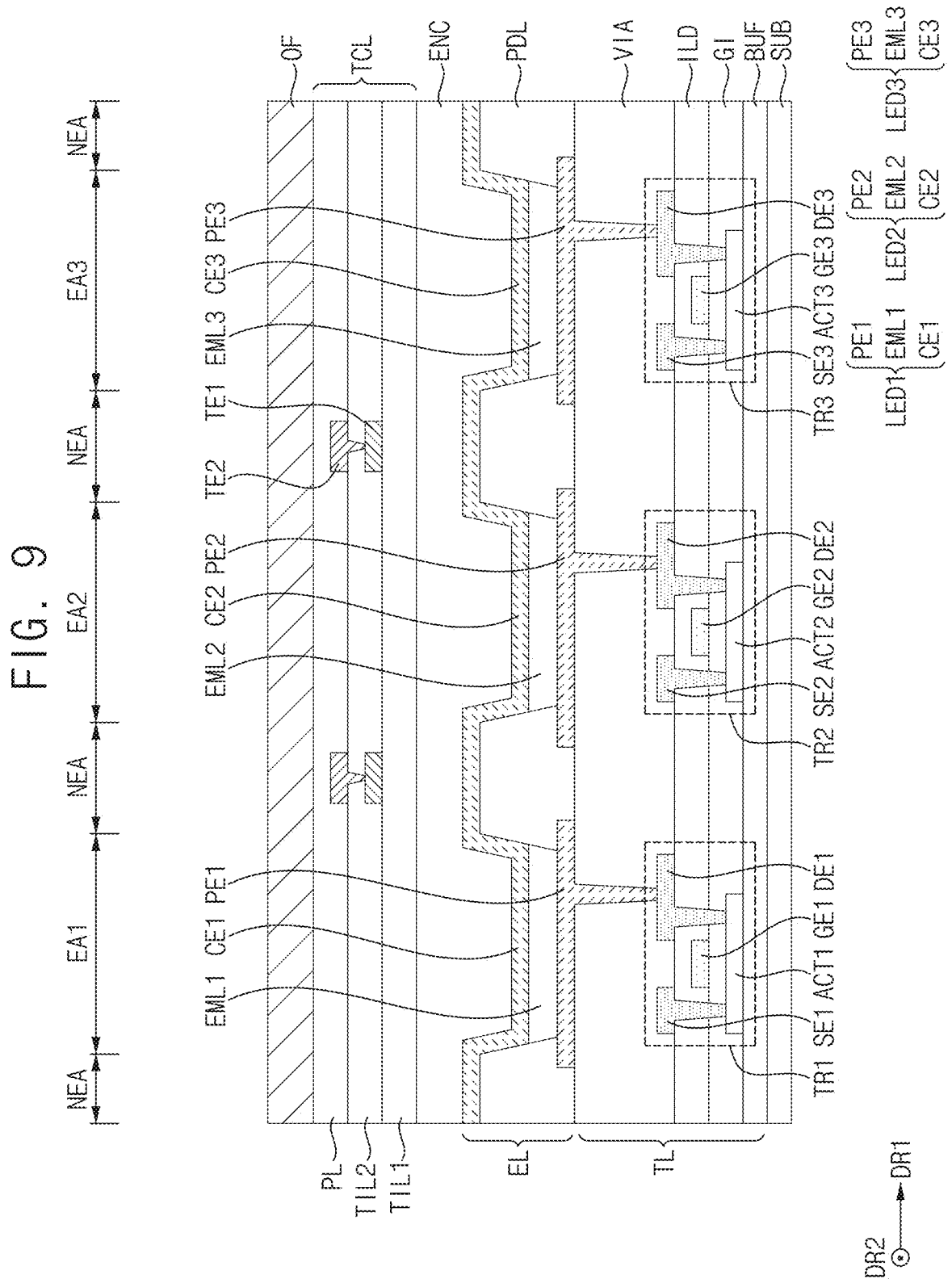

Referring to FIG. 9, an insulating film OF may be provided or formed on the protective layer PL. The insulating film OF may be entirely formed in the first light emitting area EA1, the second light emitting area EA2, the third light emitting area EA3, and the non-light emitting area NEA. In an embodiment, for example, the insulating film OF may be formed using an inorganic material or an organic material containing black pigment, black dye, and/or the like.

Figure 10:
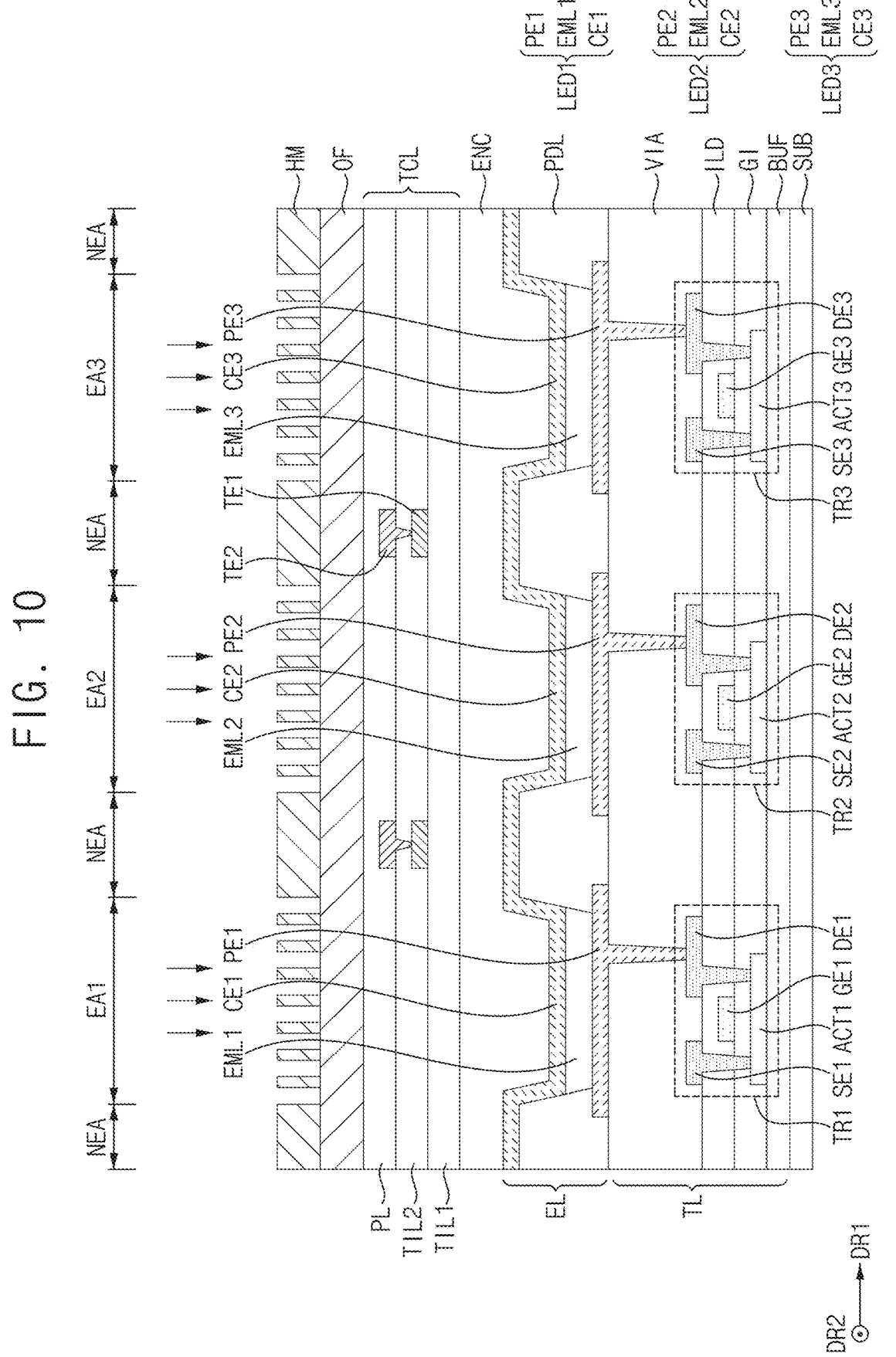
Figure 11:
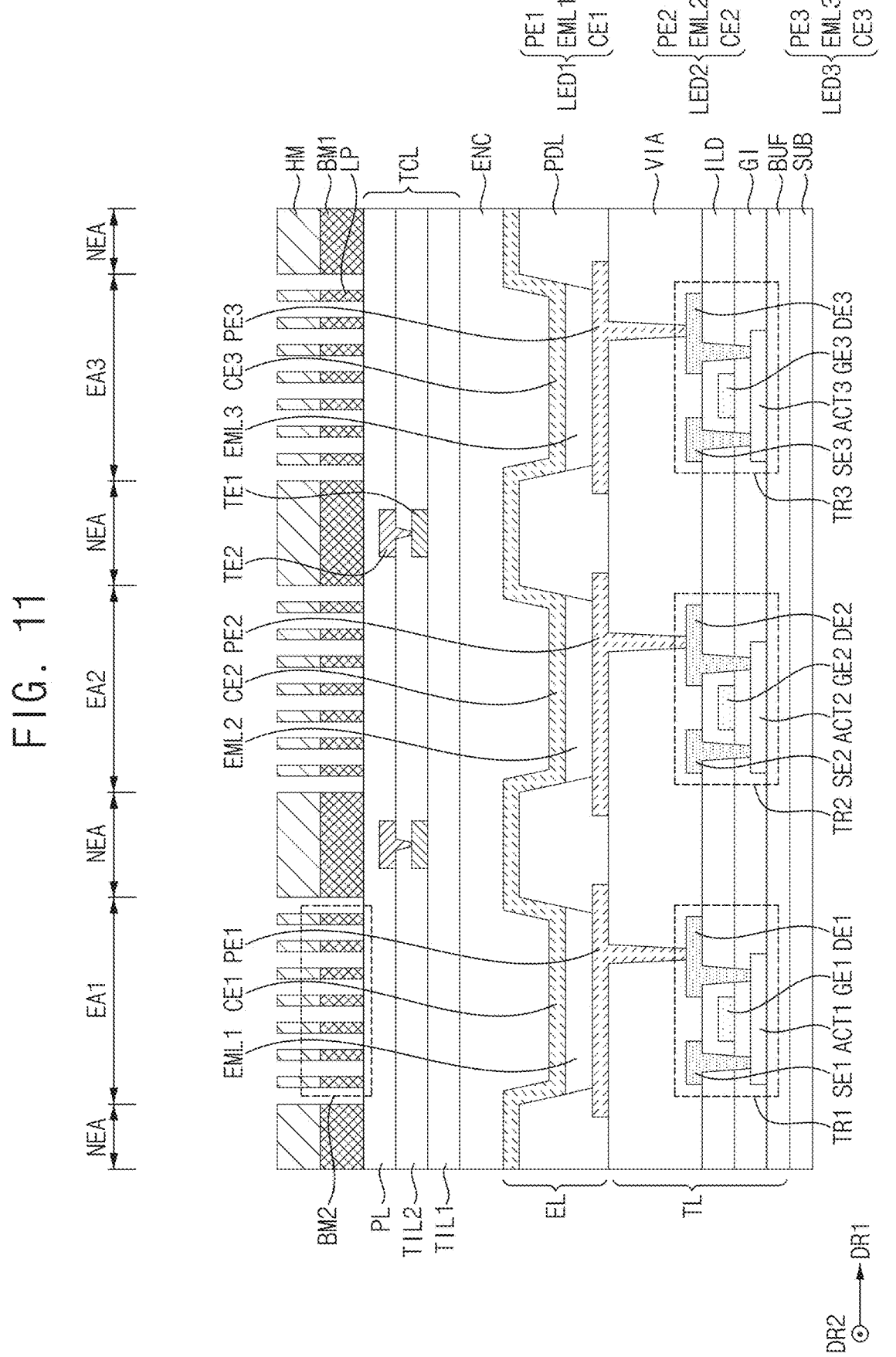
Figure 12:
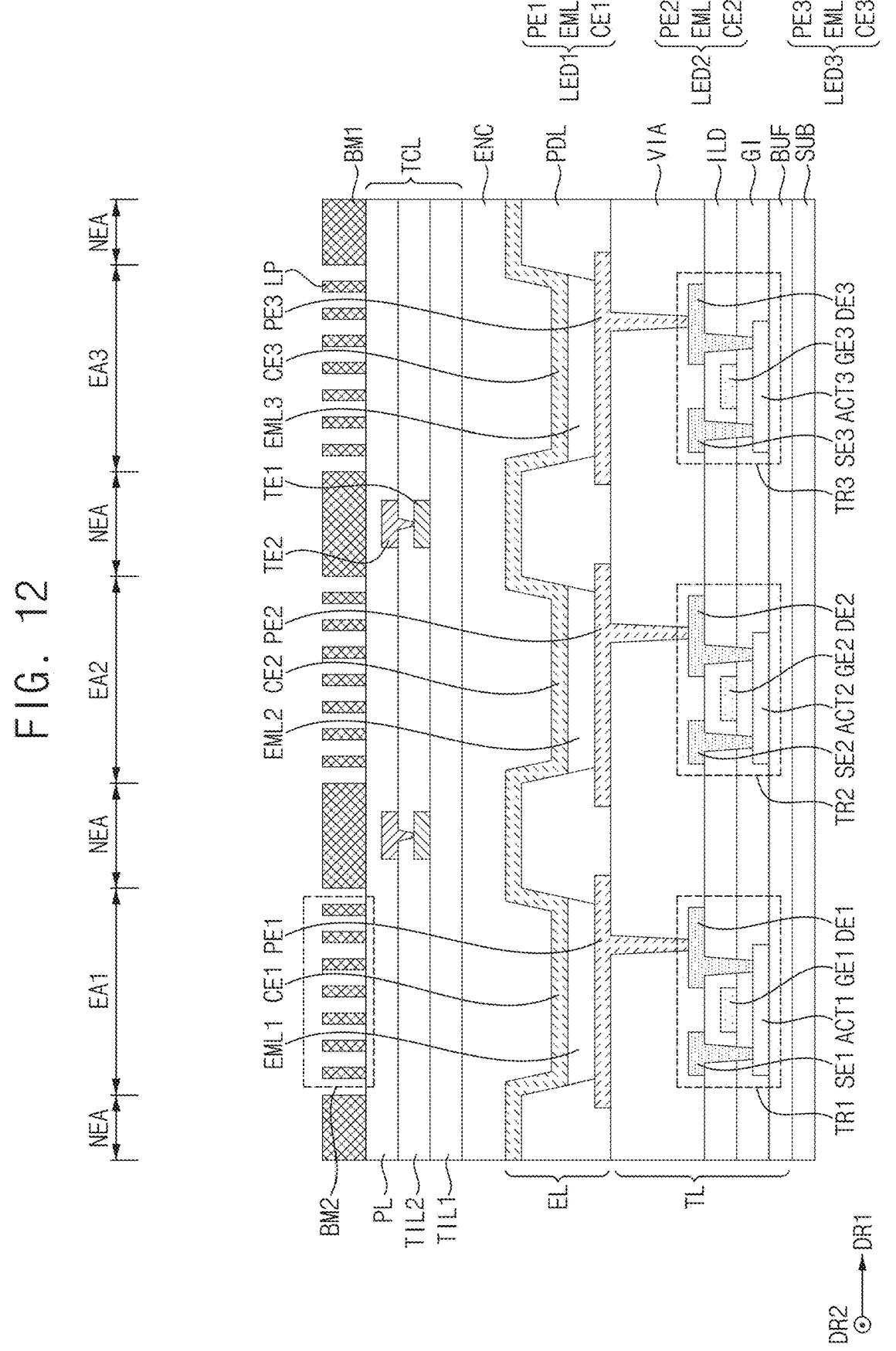

Referring to FIGS. 10, 11 and 12, a hard mask layer HM may be provided or formed on the insulating film OF. The hard mask layer HM may be entirely formed in the first light emitting area EA1, the second light emitting area EA2, the third light emitting area EA3, and the non-light emitting area NEA. The hard mask layer HM may be patterned at a portion overlapping the first light emitting area EA1, the second light emitting area EA2, and the third light emitting area EA3. Accordingly, the hard mask layer HM may include a plurality of linear patterns overlapping the first light emitting area EA1, the second light emitting area EA2, and the third light emitting area EA3 and spaced apart from each other. In an embodiment, for example, the hard mask layer HM may be formed using metal, metal oxide, or the like.

An etching process may be performed on the insulating film OF by using the hard mask layer HM as a mask. A portion of the insulating film OF that does not overlap with the hard mask layer HM may be removed through the etching process. Accordingly, the first light blocking layer BM1 overlapping the non-light emitting area NEA and the second light blocking layer BM2 overlapping the first, second, and third light emitting areas EA1, EA2, and EA3 may be formed. That is, the first light blocking layer BM1 and the second light blocking layer BM2 may be simultaneously formed through a same process as each other. After the first light blocking layer BM1 and the second light blocking layer BM2 are formed, the hard mask layer HM may be removed.

Referring back to FIGS. 2 and 4, the color filter layer CF may be provided or formed on the first light blocking layer BM1 and the second light blocking layer BM2. The color filter layer CF may include the first color filter CF1, the second color filter CF2, and the third color filter CF3.

The first color filter CF1 may partially overlap the first light emitting area EA1. The first color filter CF1 may be a red color filter that transmits red light. In an embodiment, for example, the first color filter CF1 may be formed from a red pigment and/or a color filter composition including the red pigment.

The second color filter CF2 may partially overlap the second light emitting area EA2. The second color filter CF2 may be a green color filter that transmits green light. In an embodiment, for example, the second color filter CF2 may be formed from a green pigment and/or a color filter composition including the green pigment.

The third color filter CF3 may partially overlap the third light emitting area EA3. The third color filter CF3 may be a blue color filter that transmits blue light. In an embodiment, for example, the third color filter CF3 may be formed from a blue pigment and/or a color filter composition including the blue pigment.

The overcoat layer OC may be provided or formed on the color filter layer CF. In an embodiment, for example, the overcoat layer OC may be formed using an inorganic material or an organic material. The cover window CW may be provided or formed on the overcoat layer OC. In an embodiment, for example, the cover window CW may be formed using polyimide or ultra-thin glass.

Accordingly, the display device 100 illustrated in FIG. 4 may be manufactured.

Figure 13:
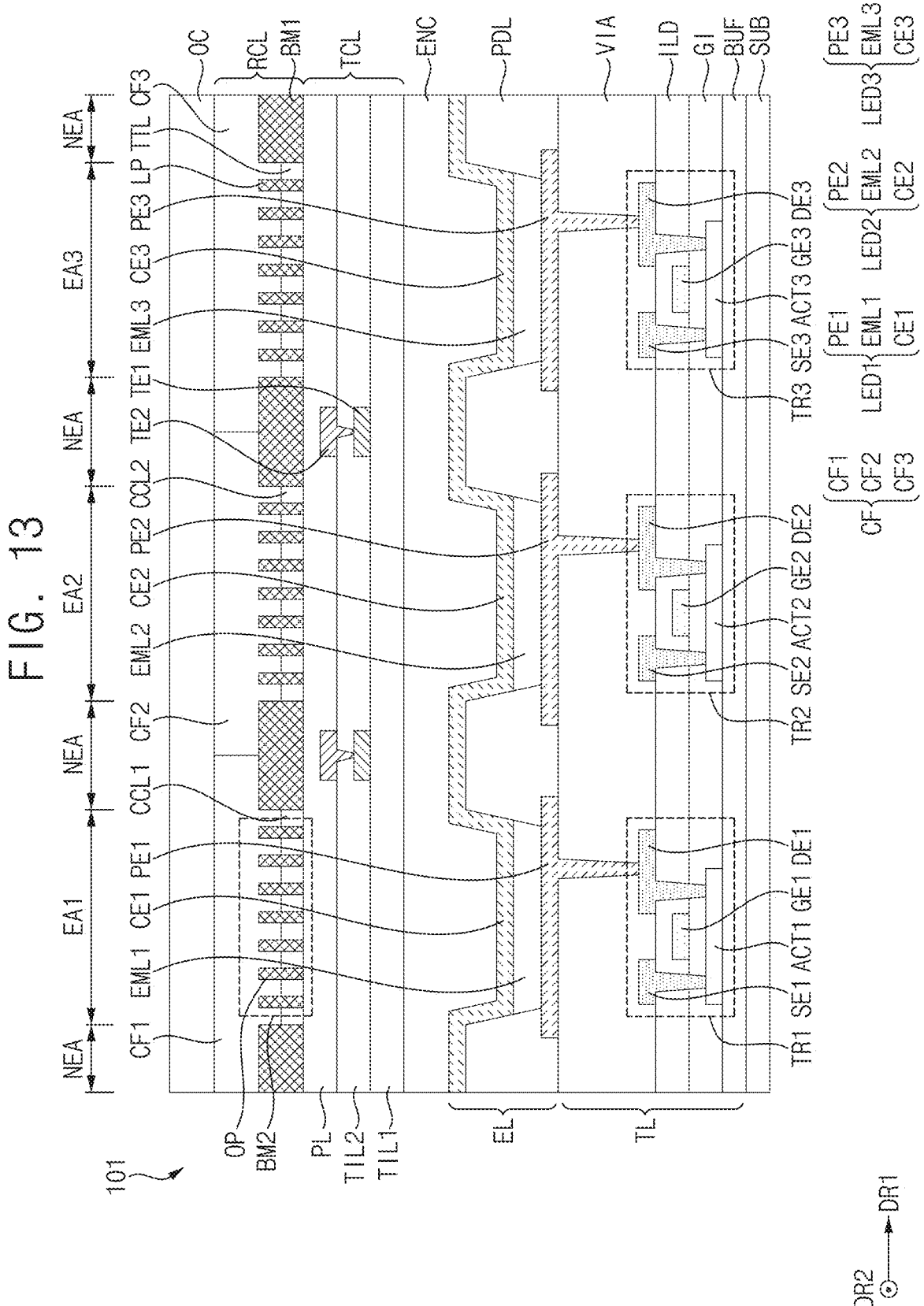
FIG. 13 is a cross-sectional view illustrating a display device according to an alternative embodiment of the disclosure.

FIG. 13 is a cross-sectional view illustrating a display device according to an alternative embodiment of the disclosure.

Referring to FIG. 13, a display device 101 according to an embodiment of the disclosure may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first, second, and third light emitting elements LED1, LED2, and LED3, encapsulation layer ENC, the touch sensing layer TCL, the first light blocking layer BM1, the second light blocking layer BM2, a first color conversion layer CCL1, a second color conversion layer CCL2, a transmission layer TTL, the color filter layer CF, and the overcoat layer OC. The embodiment of the display device 101 described with reference to FIG. 13 may be substantially the same as or similar to the embodiment of the display device 100 described with reference to FIGS. 2, 3, 4, 5, and 6 except for further including the first color conversion layer CCL1, the second color conversion layer CCL2, and the transmission layer TTL. Hereinafter, any repetitive detailed descriptions of the same or like elements in FIG. 13 as those described above will be omitted or simplified.

The first light emitting element LED1, the second light emitting element LED2, and the third light emitting element LED3 may emit light of a same color as each other. In an embodiment, for example, the first light emitting element LED1, the second light emitting element LED2, and the third light emitting element LED3 may emit blue light.

In an embodiment, the first color conversion layer CCL1, the second color conversion layer CCL2, and a transmission layer TTL may be disposed on the protective layer PL. The first color conversion layer CCL1 may overlap the first light emitting area EA1, the second color conversion layer CCL2 may overlap the second light emitting area EA2, and the transmission layer TTL may overlap the third light emitting area EA3. In an embodiment, each of the first color conversion layer CCL1, the second color conversion layer CCL2, and the transmission layer TTL may be disposed to fill the openings OP of the second light blocking layer BM2. In such an embodiment, each of the first color conversion layer CCL1, the second color conversion layer CCL2, and the transmission layer TTL may be disposed in the opening of the first light blocking layer BM1.

The first color conversion layer CCL1 may convert light (e.g., blue light) emitted from the first light emitting element LED1 into light of a first color (e.g., red light). The second color conversion layer CCL2 may convert light (e.g., blue light) emitted from the second light emitting element LED2 into light of a second color (e.g., green light). The transmission layer TTL may transmit light (e.g., blue light)

emitted from the third light emitting element LED3. However, the configuration of the disclosure is not limited thereto.

The first color conversion layer CCL1, the second color conversion layer CCL2 and the transmission layer TTL may increase the amount of light emitted from the first, second, and third light emitting elements LED1, LED2, and LED3. Accordingly, light efficiency of the display device 101 may be improved.

Figure 14:
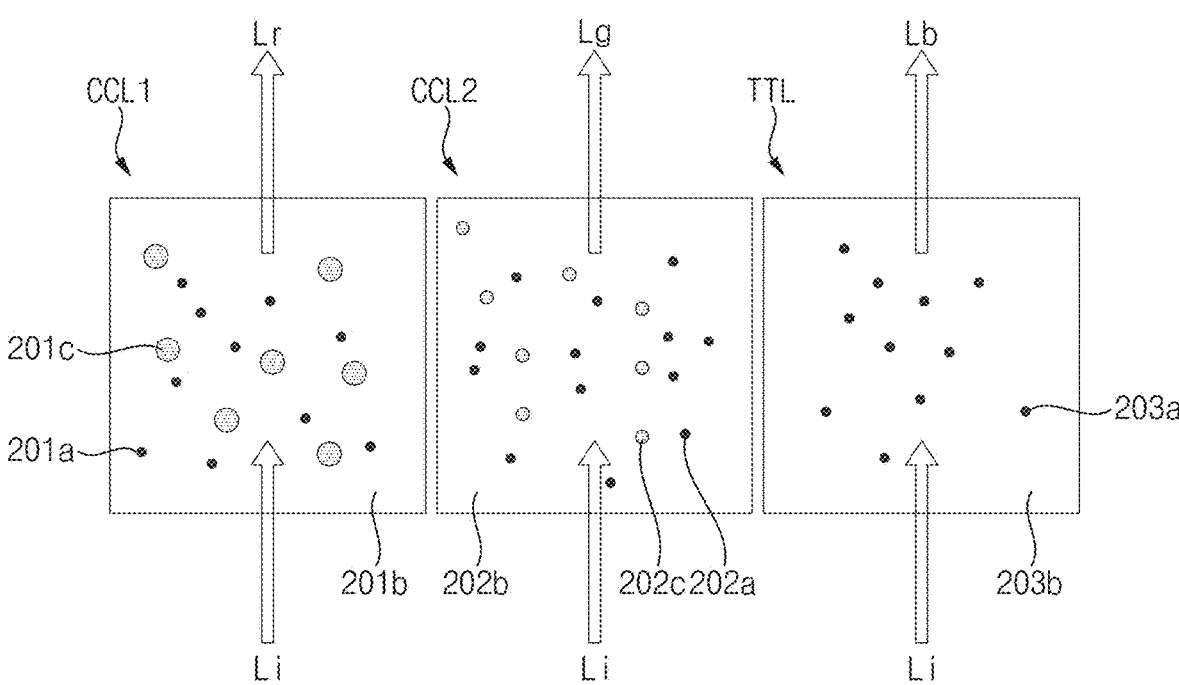
FIG. 14 is a cross-sectional view for explaining a first color conversion layer, a second color conversion layer, and a transmission layer of the display device of FIG. 13.
Figure 14:
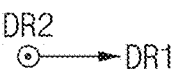

FIG. 14 is a cross-sectional view for explaining a first color conversion layer, a second color conversion layer, and a transmission layer of the display device of FIG. 13.

Referring to FIGS. 13 and 14, the first color conversion layer CCL1 may include a first base resin 201b and first quantum dots 201c dispersed in the first base resin 201b. The first quantum dots 201c may be excited by the light Li emitted from the first light emitting element LED1 to emit red light Lr. In addition, the first color conversion layer CCL1 may further include first scattering particles 201a dispersed in the first base resin 201b.

The second color conversion layer CCL2 may include a second base resin 202b and second quantum dots 202c dispersed in the second base resin 202b. The second quantum dots 202c may be excited by the light Li emitted from the second light emitting element LED2 to emit green light Lg. In addition, the second color conversion layer CCL2 may further include second scattering particles 202a dispersed in the second base resin 202b.

The transmission layer TTL may include a third base resin 203b and third scattering particles 203a dispersed in the third base resin 203b. The transmission layer TTL may transmit light Li emitted from the third light emitting element LED3 to emit blue light Lb.

In an embodiment, for example, each of the first, second, and third base resins 201b, 202b, and 203b may include a light transmitting organic material such as a silicone resin, an epoxy resin, or the like. These may be used alone or in combination with each other. The first, second, and third scattering particles 201a, 202a, and 203a may scatter and emit light emitted from the first, second, and third light emitting elements LED1, LED2, and LED3. In addition, the first, second, and third scattering particles 201a, 202a, and 203a may include the same material as each other.

Accordingly, the first light emitting area EA1 may emit the red light Lr, the second light emitting area EA2 may emit the green light Lg, and the third light emitting area EA3 may emit the blue light Lb.

Figure 15:
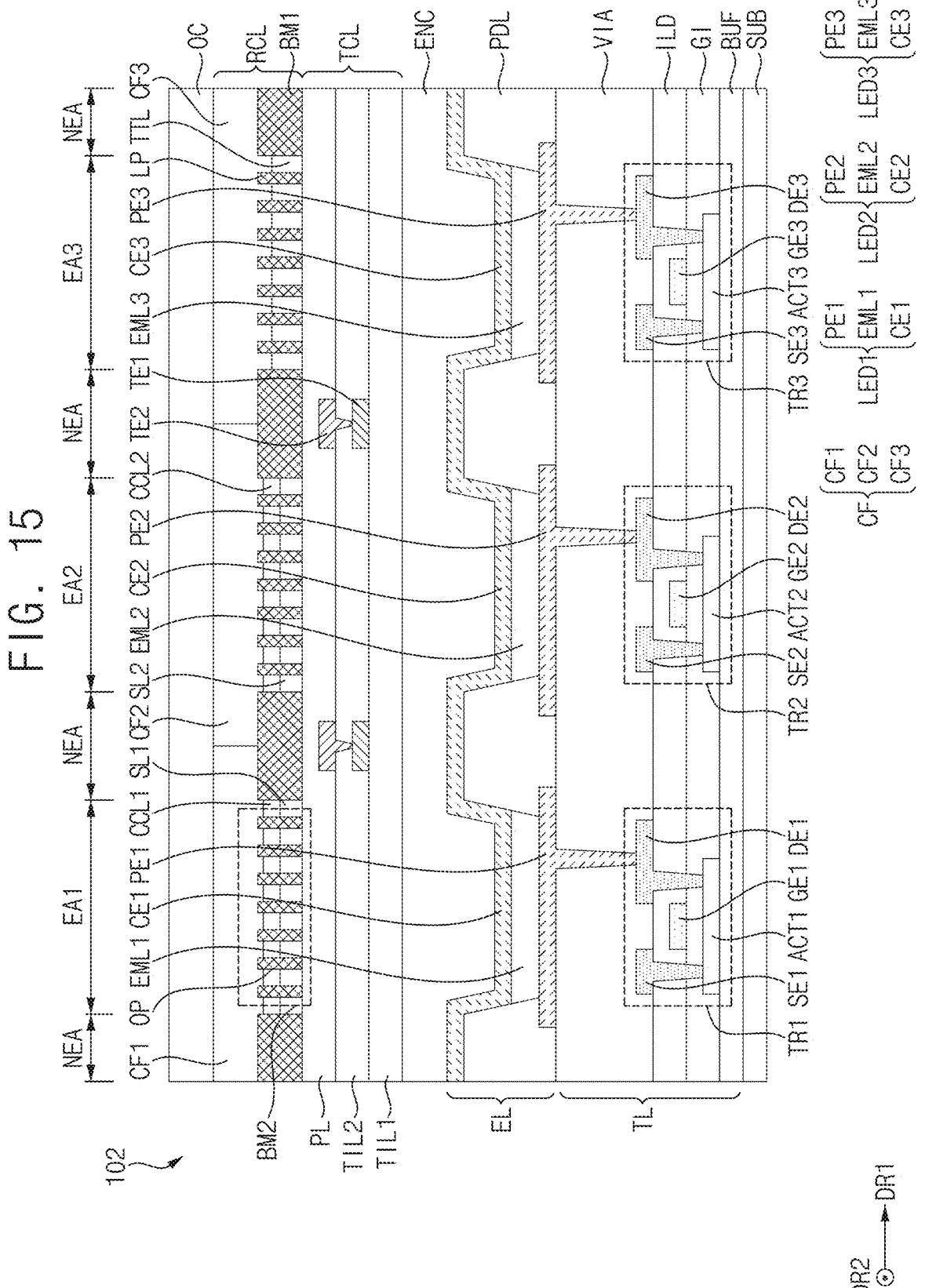
FIG. 15 is a cross-sectional view illustrating a display device according to another alternative embodiment of the disclosure.

FIG. 15 is a cross-sectional view illustrating a display device according to another alternative embodiment of the disclosure.

Referring to FIG. 15, a display device 102 according to an embodiment of the disclosure may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first, second, and third light emitting elements LED1, LED2, and LED3, encapsulation layer ENC, the touch sensing layer TCL, the first light blocking layer BM1, the second light blocking layer BM2, the first color conversion layer CCL1, the second color conversion layer CCL2, the transmission layer TTL, a first scattering layer SL1, a second scattering layer SL2, the color filter layer CF, and the overcoat layer OC. The embodiment of the display device 102 described with reference to FIG. 15 may be substantially the same as or similar to the embodiment of the display device 101 described with reference to FIGS. 13 and 14 except for further including the first scattering layer SL1 and the second scattering layer SL2. Hereinafter, any repetitive detailed descriptions of the same or like elements in FIG. 15 as those described above will be omitted or simplified.

The first light emitting element LED1, the second light emitting element LED2, and the third light emitting element LED3 may emit light of a same color as each other. In an embodiment, for example, the first light emitting element LED1, the second light emitting element LED2, and the third light emitting element LED3 may emit blue light.

The first color conversion layer CCL1, the second color conversion layer CCL2, and a transmission layer TTL may be disposed on the protective layer PL. The first color conversion layer CCL1 may overlap the first light emitting area EA1, the second color conversion layer CCL2 may overlap the second light emitting area EA2, and the transmission layer TTL may overlap the third light emitting area EA3. In an embodiment, each of the first color conversion layer CCL1, the second color conversion layer CCL2, and the transmission layer TTL may be disposed to fill the openings OP of the second light blocking layer BM2. In such an embodiment, each of the first color conversion layer CCL1, the second color conversion layer CCL2, and the transmission layer TTL may be disposed in the opening of the first light blocking layer BM1.

In an embodiment, the first scattering layer SL1 may be disposed under the first color conversion layer CCL1, and the second scattering layer SL2 may be disposed under the second color conversion layer CCL2. In such an embodiment, each of the first and second scattering layers SL1 and SL2 may be disposed to fill a gap between the second light blocking layer BM2 and the first light blocking layer BM1.

The first scattering layer SL1 may include a first base resin and first scattering particles dispersed in the first base resin, and the second scattering layer SL2 may include a second base resin and second scattering particles dispersed in the second base resin. In such an embodiment, each of the first color conversion layer CCL1 and the second color conversion layer CCL2 may not include scattering particles.

In an alternative embodiment, the first scattering layer SL1 may be disposed on the first color conversion layer CCL1, and the second scattering layer SL2 may be disposed on the second color conversion layer CCL2.

Figure 16:
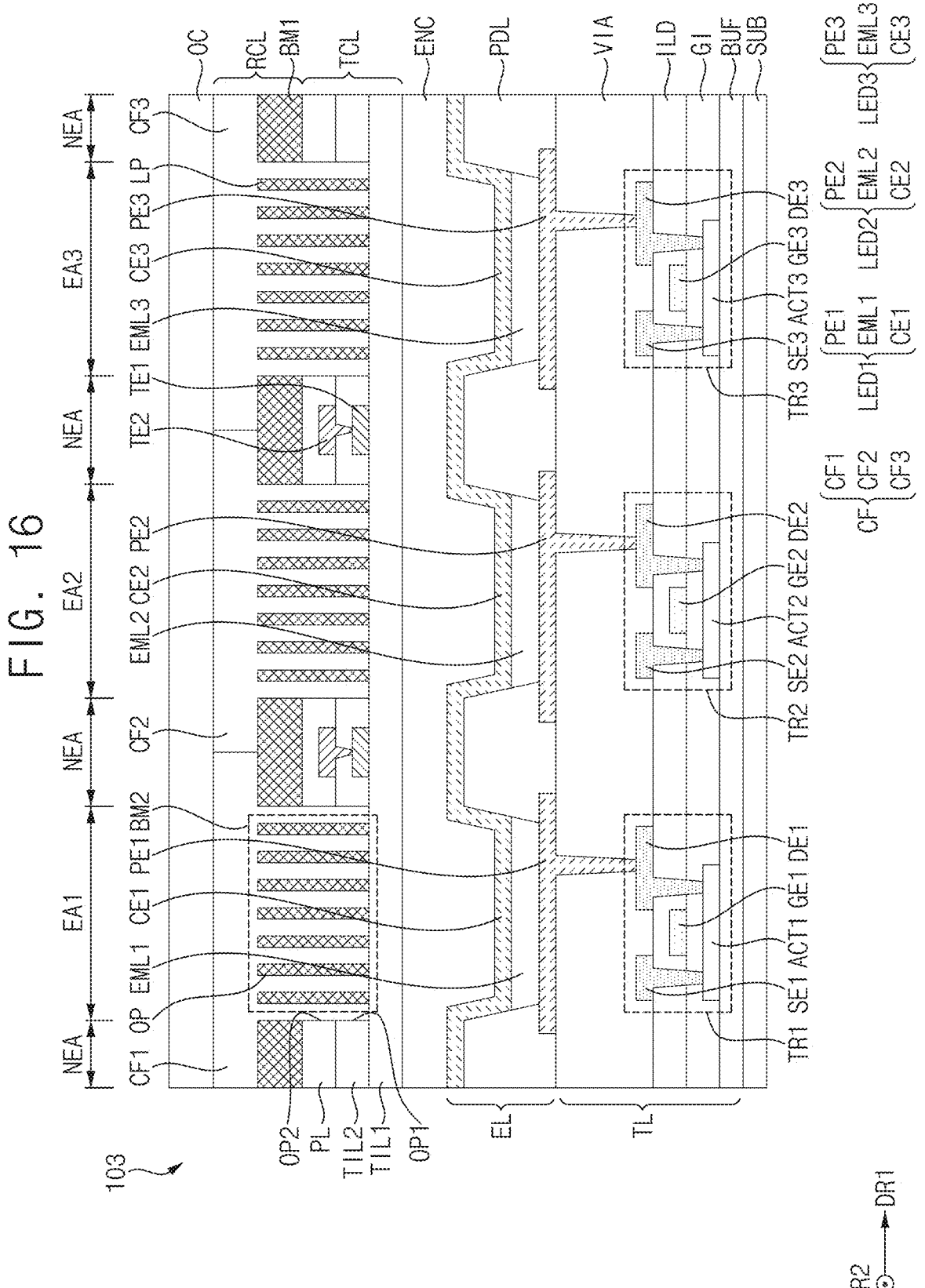
FIG. 16 is a cross-sectional view illustrating a display device according to still another alternative embodiment of the disclosure.

FIG. 16 is a cross-sectional view illustrating a display device according to still another alternative embodiment of the disclosure.

Referring to FIG. 16, a display device 103 according to an embodiment of the disclosure may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first, second, and third light emitting elements LED1, LED2, and LED3, encapsulation layer ENC, the touch sensing layer TCL, the first light blocking layer BM1, the second light blocking layer BM2, the color filter layer CF, and the overcoat layer OC. The embodiment of the display device 103 described with reference to FIG. 16 may be substantially the same as or similar to the embodiment of the display device 100 described with reference to FIGS. 2, 3, 4, 5, and 6 except for the structures of the second light blocking layer BM2 and the touch sensing layer TCL. Hereinafter, any repetitive detailed descriptions of the same or like elements in FIG. 16 as those described above will be omitted or simplified.

The first touch insulating layer TILL the first touch electrode TE1, the second touch insulating layer TIL2, the second touch electrode TE2, and the protective layer PL may be sequentially disposed on the encapsulation layer ENC.

In an embodiment, a first opening OP1 overlapping each of the first light emitting area EA1, the second light emitting area EA2, and the third light emitting area EA3 may be defined in the second touch insulating layer TIL2, and a second opening OP2 overlapping each of the first light emitting area EA1, the second light emitting area EA2, and the third light emitting area EA3 may be defined in the protective layer PL. Each of the first opening OP1 and the second opening OP2 may expose an upper surface of the first touch insulating layer TIL1.

The second light blocking layer BM2 may be disposed on first touch insulating layer TIL1. The second light blocking layer BM2 may overlap the first light emitting area EA1, the second light emitting area EA2, and the third light emitting area EA3. In an embodiment, the second light blocking layer BM2 may be disposed in the first opening OP1 and the second opening OP2. As the second light blocking layer BM2 is disposed in the first opening OP1 and the second opening OP2, a distance between the first, second, and third light emitting layers EML1, EML2, and EML3 and the second light blocking layer BM2 may be reduced. Accordingly, light efficiency of the display device 103 may be improved.

In an embodiment, the upper surface of the second light blocking layer BM2 may be positioned at a same level as the upper surface of the first light blocking layer BM1 with respect to the substrate SUB. In such an embodiment, the thickness of the second light blocking layer BM2 may be greater than the thickness of the first light blocking layer BM1. In an embodiment, for example, the first light blocking layer BM1 and the second light blocking layer BM2 may be formed through a halftone mask process.

Figure 17:
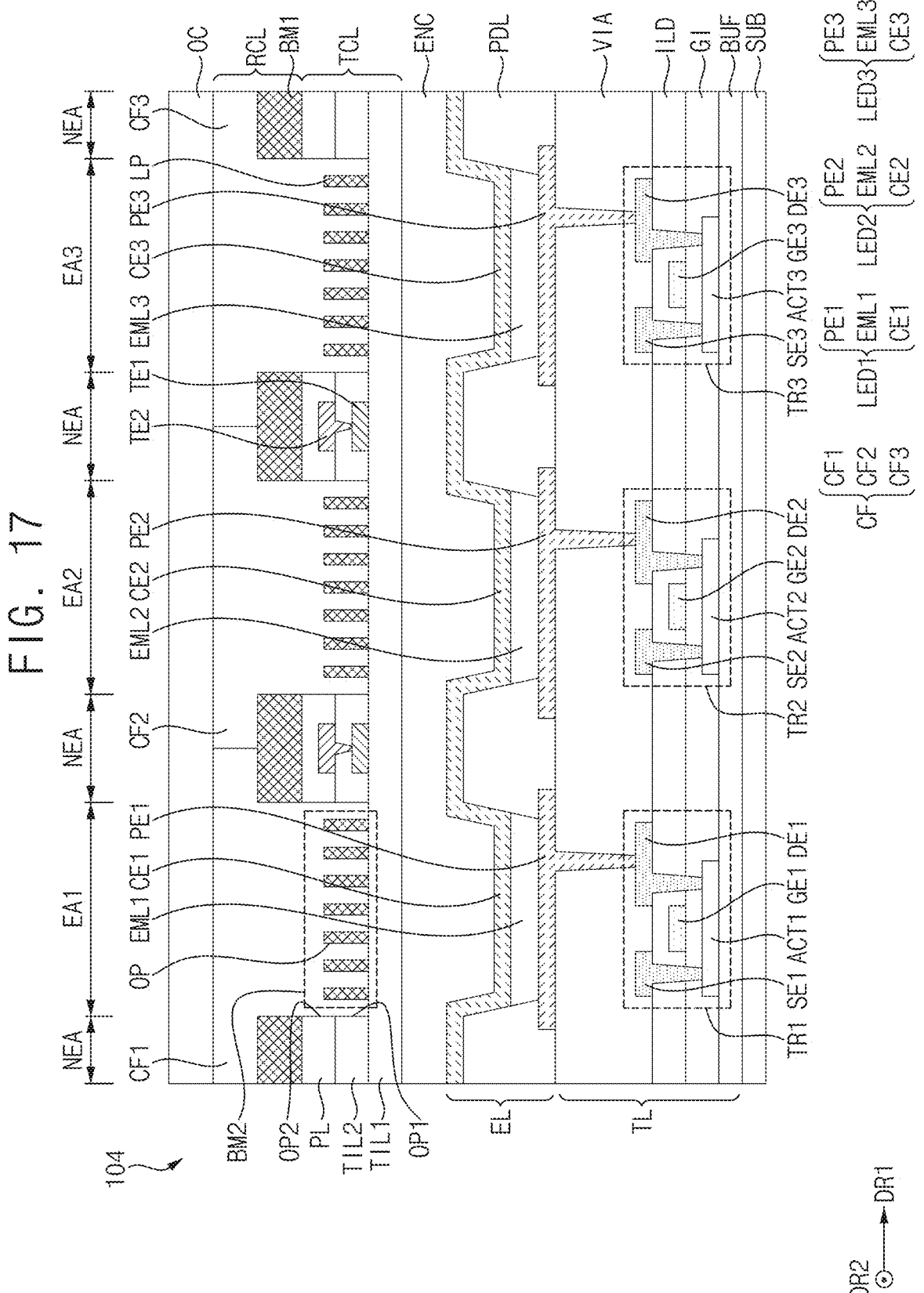
FIG. 17 is a cross-sectional view illustrating a display device according to still another alternative embodiment of the disclosure.

FIG. 17 is a cross-sectional view illustrating a display device according to still another alternative embodiment of the disclosure.

Referring to FIG. 17, a display device 104 according to an embodiment of the disclosure may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first, second, and third light emitting elements LED1, LED2, and LED3, encapsulation layer ENC, the touch sensing layer TCL, the first light blocking layer BM1, the second light blocking layer BM2, the color filter layer CF, and the overcoat layer OC. The embodiment of the display device 104 described with reference to FIG. 17 may be substantially the same as or similar to the embodiment of the display device 100 described with reference to FIGS. 2, 3, 4, 5, and 6 except for the structure of the second light blocking layer BM2 and the touch sensing layer TCL. Hereinafter, any repetitive detailed descriptions of the same or like elements in FIG. 17 as those described above will be omitted or simplified.

The first touch insulating layer TILL the first touch electrode TE1, the second touch insulating layer TIL2, the second touch electrode TE2, and the protective layer PL may be sequentially disposed on the encapsulation layer ENC.

In an embodiment, a first opening OP1 overlapping each of the first light emitting area EA1, the second light emitting area EA2, and the third light emitting area EA3 may be defined in the second touch insulating layer TL2, and a second opening OP2 overlapping each of the first light emitting area EA1, the second light emitting area EA2, and the third light emitting area EA3 may be defined in the protective layer PL. Each of the first opening OP1 and the second opening OP2 may expose an upper surface of the first touch insulating layer TL1.

The second light blocking layer BM2 may be disposed on first touch insulating layer TILL The second light blocking layer BM2 may overlap the first light emitting area EA1, the second light emitting area EA2, and the third light emitting area EA3. In an embodiment, the second light blocking layer BM2 may be disposed in the first opening OP1 and the second opening OP2. As the second light blocking layer BM2 is disposed in the first opening OP1 and the second opening OP2, a distance between the first, second, and third light emitting layers EML1, EML2, and EML3 and the second light blocking layer BM2 may be reduced. Accordingly, light efficiency of the display device 104 may be improved.

In an embodiment, the upper surface of the second light blocking layer BM2 may be positioned at a lower level than the upper surface of the first light blocking layer BM1 with respect to the substrate SUB. In such an embodiment, the thickness of the second light blocking layer BM2 may be equal to the thickness of the first light blocking layer BM1.

Figure 18:
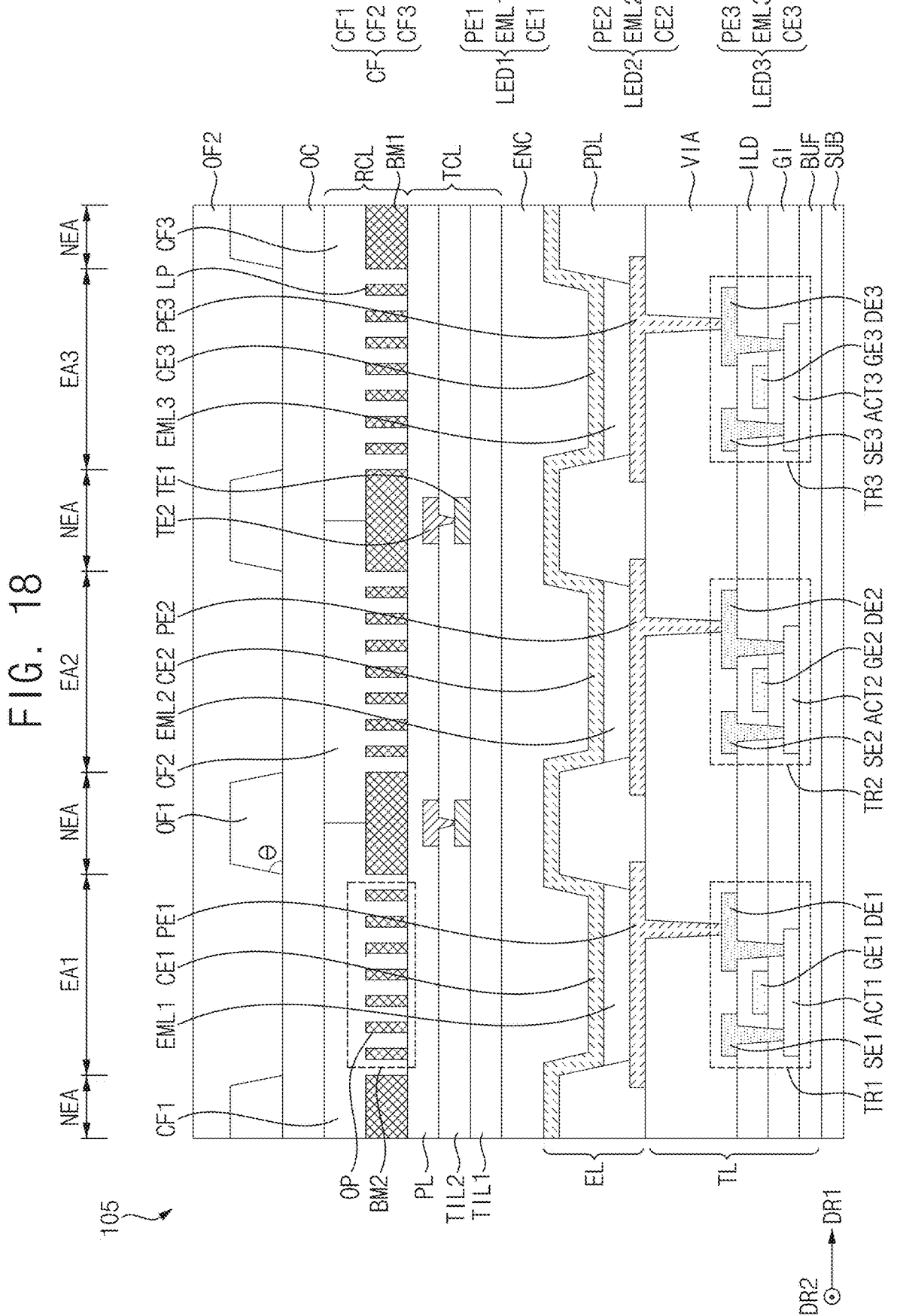
FIG. 18 is a cross-sectional view illustrating a display device according to still another alternative embodiment of the disclosure.

FIG. 18 is a cross-sectional view illustrating a display device according to still another alternative embodiment of the disclosure.

Referring to FIG. 18, a display device 105 according to an embodiment of the disclosure may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first, second, and third light emitting elements LED1, LED2, and LED3, encapsulation layer ENC, the touch sensing layer TCL, the first light blocking layer BM1, the second light blocking layer BM2, the color filter layer CF, the overcoat layer OC, a first organic film OF1, and a second organic film OF2. The embodiment of the display device 105 described with reference to FIG. 18 may be substantially the same as or similar to the embodiment of the display device 100 described with reference to FIGS. 2, 3, 4, 5, and 6 except for further including the first organic film OF1 and the second organic film OF2. Hereinafter, any repetitive detailed descriptions of the same or like elements in FIG. 18 as those described above will be omitted or simplified.

The first organic film OF1 may be disposed on the overcoat layer OC. In an embodiment, the first organic film OF1 may be provided in plural, that is, a plurality of first organic films OF1 may be provided. Each of the first organic films OF1 may overlap the non-light emitting area NEA. The refractive index of the first organic film OF1 may be less than the refractive index of the second organic film OF2 with respect to visible light. In an embodiment, for example, the first organic film OF1 may include an organic material.

A side surface of the first organic film OF1 may have a tapered cross-sectional shape. In an embodiment, the taper angle θ of the first organic film OF1 may be in a range of about 70 degrees to about 85 degrees. Accordingly, light incident on the side surface of the first organic film OF1 may be reflected and emitted toward the front of the display device 105. That is, among the lights emitted from the first, second, and third light emitting elements LED1, LED2, and LED3, light incident on the side surface of the first organic film OF1 may be reflected and focused toward the front of the display device 105.

The second organic film OF2 may be disposed on the overcoat layer OC and the first organic film OF1. The second organic film OF2 may sufficiently cover the first organic film OF1. The refractive index of the second organic film OF2 may be greater than the refractive index of the first organic film OF1 with respect to visible light. In an embodiment, for example, the refractive index of the second organic film OF2 may be in a range of about 1.7 to about 1.8 with respect to visible light. In an embodiment, for example, the second organic film OF2 may include an organic material.

Figure 19:
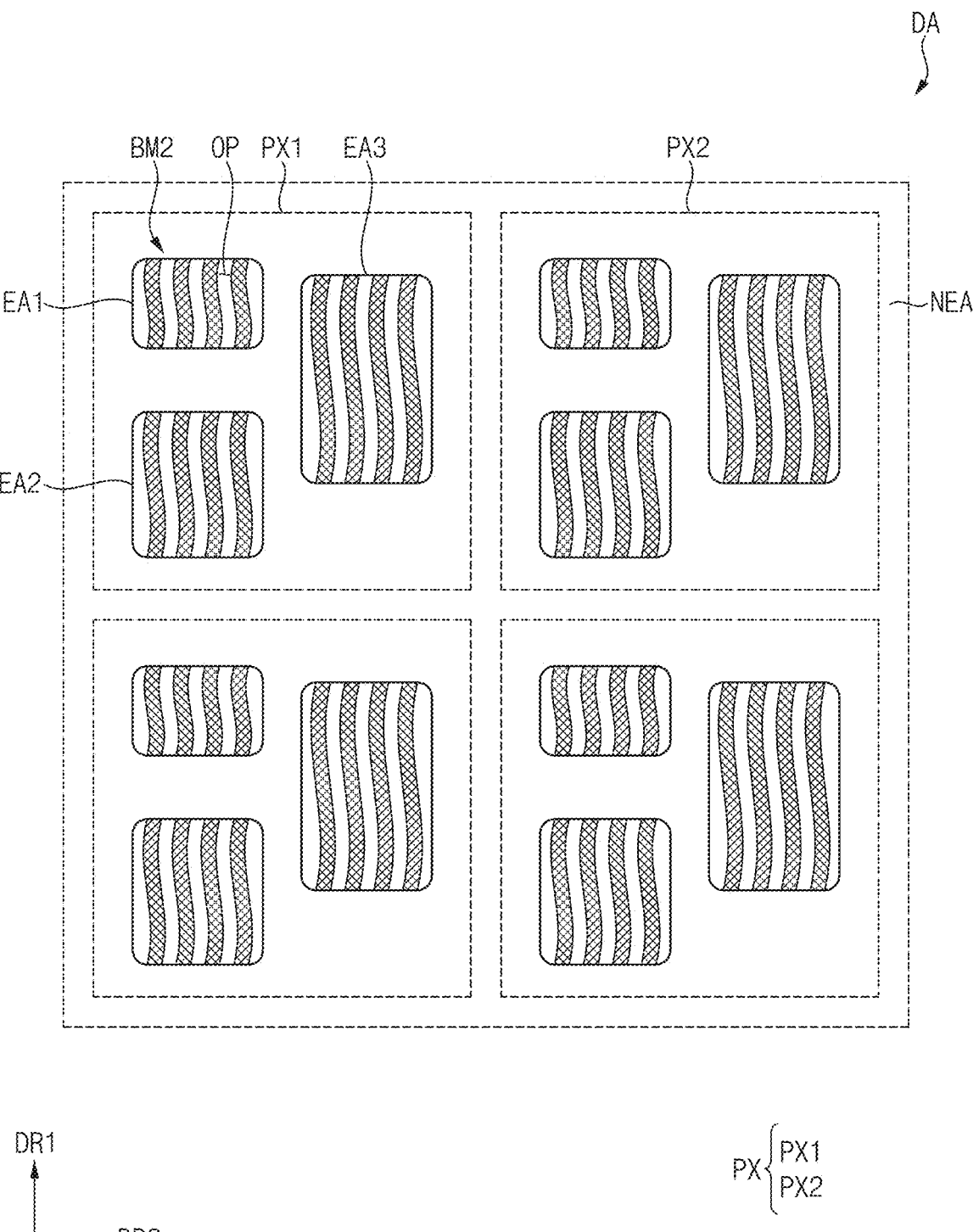
FIGS. 19, 20, and 21 are enlarged plan views of other examples of a display area of the display device of FIG. 1.
Figure 20:
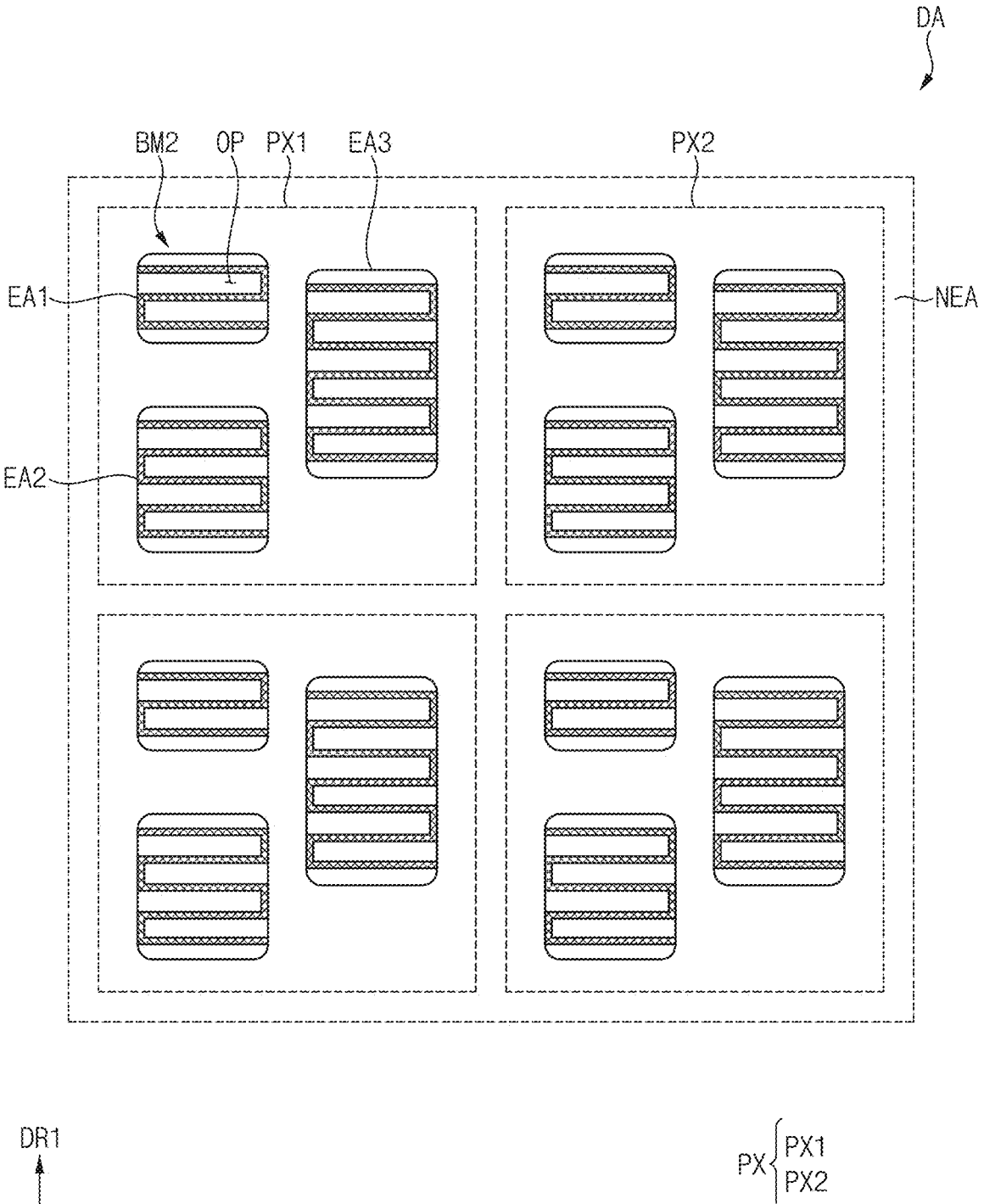
Figure 21:
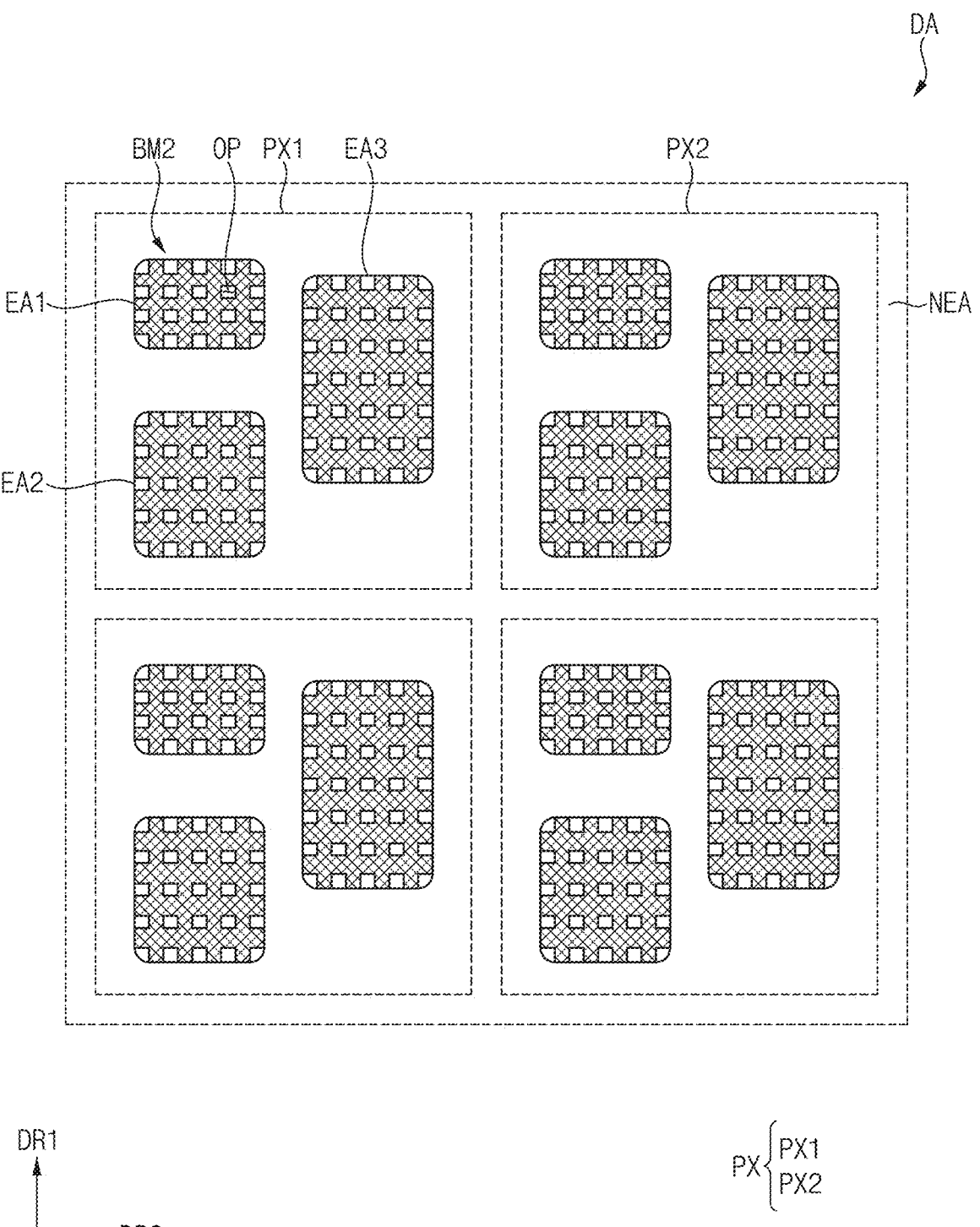

FIGS. 19, 20, and 21 are enlarged plan views of other examples of a display area of the display device of FIG. 1.

Hereinafter, any repetitive detailed descriptions of the same or like elements in FIGS. 19, 20, and 21 as those of the display device 100 described with reference to FIG. 3 will be omitted or simplified.

The display device may include a second light blocking layer BM2 disposed in each of the first, second, and third light emitting areas EA1, EA2, and EA3. A plurality of openings OP may be defined in the second light blocking layer BM2.

In an embodiment, as illustrated in FIG. 19, the second light blocking layer BM2 may include a plurality of non-linear patterns each extending in the first direction DR1 and arranged along the second direction DR2. In such an embodiment, the openings OP of the second light blocking layer BM2 may be arranged along the second direction DR2.

In an alternative embodiment, as illustrated in FIG. 20, the second light blocking layer BM2 may have a zigzag shape (or a zigzag shaped pattern) in the plan view.

In another alternative embodiment, as illustrated in FIG. 21, the second light blocking layer BM2 may have a mesh shape (or a mesh shaped pattern) in the plan view. In such an embodiment, the openings OP of the second light blocking layer BM2 may be arranged in a matrix form along the first and second directions DR1 and DR2.

However, the configuration of the disclosure is not limited thereto, and the second light blocking layer BM2 may be arranged in various forms.

Figure 23:
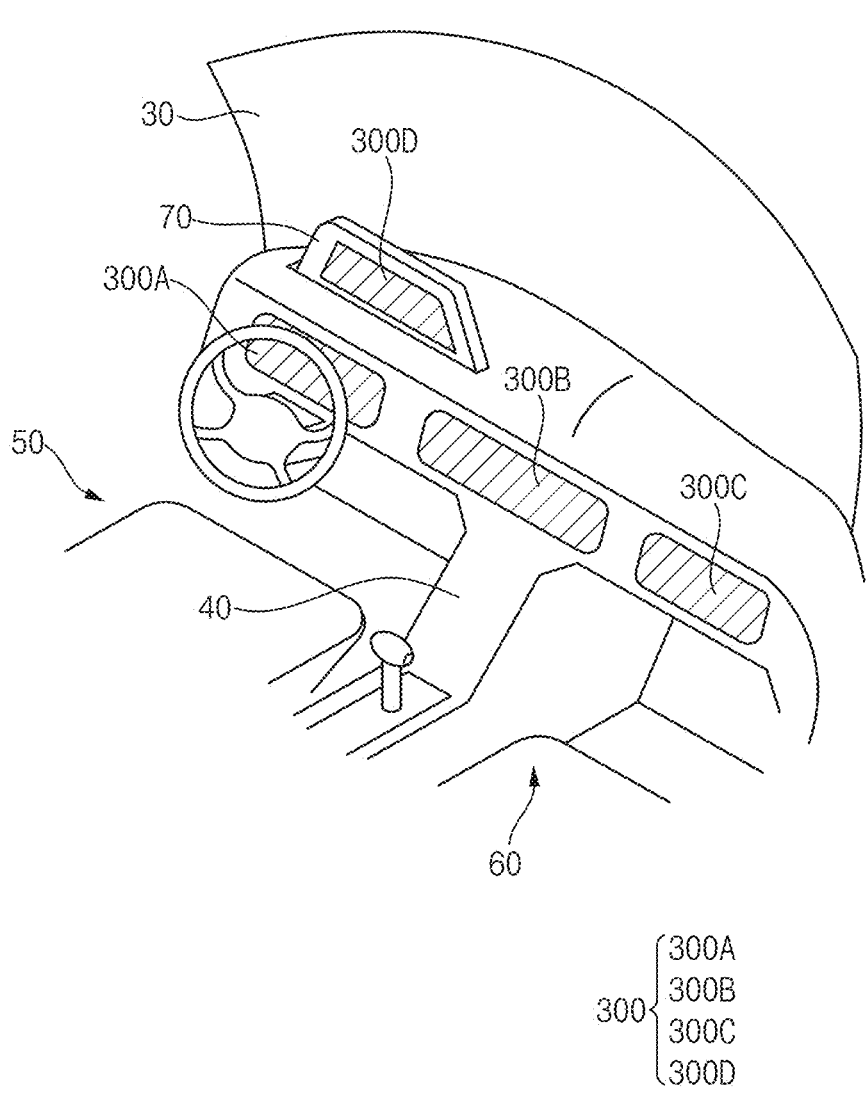
FIG. 23 is a view illustrating an inside of the automobile of FIG. 22.

FIG. 22 is a schematic view of an automobile. FIG. 23 is a view illustrating an inside of the automobile of FIG. 22.

Referring to FIGS. 22 and 23, an automobile 10 may include a vehicle body 20 and a vehicle display device 300. The vehicle body 20 may form the exterior of the automobile and may define an indoor space in which a driver and a passenger ride. The vehicle body may include a windshield 30 that protects the driver and passenger from the outside and provides the driver with a view. The vehicle display device 300 may be disposed in the indoor space. The vehicle display device 300 may have substantially the same structure as the display devices 100, 101, 102, 103, 104, or 105 illustrated in FIG. 4, 6, 13, 15, 16, 17, or 18.

The vehicle display device 300 may include first, second, third, and fourth display devices 300A, 300B, 300C, and 300D. The first, second, and third display devices 300A, 300B, and 300C may be disposed on the dashboard 40 provided in the indoor space. For example, the first display device 300A may be disposed on the dashboard 40 in front of the driver's seat 50 to provide speed information and the like to the driver, and the second display device 300B may be disposed in the center of the dashboard 40 to provide map information and the like. In addition, the third display device 300C may be disposed on the dashboard 40 in front of the passenger seat 60 to provide entertainment information to the passenger.

In addition, the fourth display device 300D may be included in a vehicle head up display 70. The vehicle head up display 70 may be disposed on the dashboard 40. For example, the fourth display device 300D may provide the driver with information helpful for driving.

The third display device 300C disposed on the dashboard 40 may adjust the viewing angle according to the mode. In an embodiment, the third display device 300C may display an image in a wide viewing angle mode or a narrow viewing angle mode. In an embodiment, for example, the wide viewing angle mode may mean a state in which the viewing angle of the third display device 300C is wide. In the wide viewing angle mode, an image may be displayed to the driver in the driver's seat 50 as well as the passenger in a passenger seat 60. Accordingly, both the passenger and the driver may check the image of the third display device 300C.

In such an embodiment, the narrow viewing angle mode may mean a state in which the field of view of the third display device 300C is narrow. In the narrow viewing angle mode, an image may be displayed only to the passenger in the front passenger seat 60, and may not be displayed to the driver in the driver's seat 50. Accordingly, only the passenger may check the image of the third display device 300C.

Although the description has been made based on the third display device 300C disposed on the dashboard 40, the disclosure is not limited thereto. For example, the viewing angles of the first display device 300A, the second display device 300B, and the fourth display device 300D may be adjusted according to the mode.

In addition, although it has been described that the vehicle display device 300 is disposed on the dashboard 40, the disclosure is not limited thereto. For example, the vehicle display device 300 may be disposed on the windshield 30.

The disclosure can be applied to various display devices. For example, the disclosure is applicable to various display devices such as display devices for vehicles, ships and aircraft, portable communication devices, display devices for exhibition or information transmission, medical display devices, and the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a light emitting area and a non-light emitting area adjacent to the light emitting area;
a light emitting element disposed in the light emitting area on the substrate;
an encapsulation layer disposed on the light emitting element;
a first light blocking layer disposed in the non-light emitting area on the encapsulation layer;
a second light blocking layer disposed in the light emitting area on the encapsulation layer to overlap the light emitting element, wherein the second light blocking layer includes a same material as the first light blocking layer, and a plurality of openings is defined through the second light blocking layer; and
a color filter layer disposed on the first light blocking layer and the second light blocking layer.

2. The display device of claim 1, wherein an upper surface of the second light blocking layer is positioned at a same level as an upper surface of the first light blocking layer with respect to the substrate.

3. The display device of claim 1, wherein an upper surface of the second light blocking layer is positioned at a level lower than an upper surface of the first light blocking layer with respect to the substrate.

4. The display device of claim 1, further comprising:

an anti-reflective coating layer surrounding at least a portion of the second light blocking layer and including a metal material.

5. The display device of claim 1, wherein the first light blocking layer includes an inorganic material or an organic material including at least one selected from a black pigment and a black dye.

6. The display device of claim 1, further comprising:

a color conversion layer disposed to fill the openings of the second light blocking layer, wherein the color conversion layer includes a base resin and quantum dots dispersed in the base resin thereof.

7. The display device of claim 6, wherein the color conversion layer further includes scattering particles dispersed in the base resin thereof.

8. The display device of claim 6, further comprising:

a scattering layer disposed under or on the color conversion layer, wherein the scattering layer includes a base resin and scattering particles dispersed in the base resin thereof.

9. The display device of claim 1, further comprising:

a touch sensing layer including:

a first touch insulating layer disposed on the encapsulating layer;

a first touch electrode disposed on the first touch insulating layer;

a second touch insulating layer disposed on the first touch insulating layer and the first touch electrode;

a second touch electrode disposed on the second touch insulating layer and connected to the first touch electrode through a contact hole defined in the second touch insulating layer; and a protective layer disposed on the second touch insulating layer and the second touch electrode, wherein an opening overlapping the light emitting area is defined in each of the second touch insulating layer and the protective layer, and wherein the second light blocking layer is disposed in the opening of each of the second touch insulating layer and the protective layer.

10. The display device of claim 9, wherein an upper surface of the second light blocking layer is positioned at a same level as an upper surface of the first light blocking layer with respect to the substrate.

11. The display device of claim 10, wherein a thickness of the second light blocking layer is greater than a thickness of the first light blocking layer.

12. The display device of claim 9, wherein an upper surface of the second light blocking layer is positioned at a level lower than an upper surface of the first light blocking layer with respect to the substrate.

13. The display device of claim 12, wherein a thickness of the second light blocking layer is equal to a thickness of the first light blocking layer.

14. The display device of claim 1, further comprising:

a first organic film disposed in the non-light emitting area on the color filter layer; and a second organic film disposed in the light emitting area and the non-light emitting area on the color filter layer and having a refractive index higher than a refractive index of the first organic film.

15. The display device of claim 14, wherein a side surface of the first organic film has a tapered cross-sectional shape.

16. The display device of claim 15, wherein a taper angle of the first organic film is in a range of about 70 degrees to about 85 degrees.

17. The display device of claim 1, wherein the second light blocking layer includes a plurality of linear patterns or a plurality of non-linear patterns, or the second light blocking layer has a mash shape or a zigzag shape in a plan view.

18. A display device comprising:

a substrate including first, second, and third light emitting areas and a non-light emitting area adjacent to the first, second, and third light emitting areas;

a light emitting element disposed in each of the first, second, and third light emitting areas on the substrate;

an encapsulation layer disposed on the light emitting element;

a first light blocking layer disposed in the non-light emitting area on the encapsulation layer;

a second light blocking layer disposed in each of the first, second, and third light emitting areas on the encapsulation layer to overlap the light emitting element therein, wherein the second light blocking layer includes a same material as the first light blocking layer, an upper surface of the second light blocking layer is positioned at a lower level than an upper surface of the first light blocking layer with respect to the substrate, and a plurality of openings is defined through the second light blocking layer; and a color filter layer disposed on the first light blocking layer and the second light blocking layer.

19. The display device of claim 18, further comprising:

a first color conversion layer disposed to fill the openings of the second light blocking layer and overlapping the first light emitting area, wherein the first color conversion layer includes a first base resin and first quantum dots dispersed in the first base resin;

a second color conversion layer disposed to fill the openings of the second light blocking layer and overlapping the second light emitting area, wherein the second color conversion layer includes a second base resin and second quantum dots dispersed in the second base resin; and a transmission layer disposed to fill the openings of the second light blocking layer and overlapping the third light emitting area, wherein the transmission layer includes a third base resin and third scattering particles dispersed in the third base resin.

20. The display device of claim 19, further comprising:

a first scattering layer disposed below or above the first color conversion layer, wherein the first scattering layer includes a fourth base resin and first scattering particles dispersed in the fourth base resin; and a second scattering layer disposed below or above the second color conversion layer, wherein the second scattering layer includes a fifth base resin and second scattering particles dispersed in the fifth base resin.

* * * * *